United States Patent
Li et al.

(10) Patent No.: US 11,367,491 B1
(45) Date of Patent: Jun. 21, 2022

(54) TECHNIQUE FOR ADJUSTING READ TIMING PARAMETERS FOR READ ERROR HANDLING

(71) Applicant: Western Digital Technologies, Inc., San Jose, CA (US)

(72) Inventors: Liang Li, Shanghai (CN); Xuan Tian, Shanghai (CN); Vincent Yin, Shanghai (CN); Jiahui Yuan, Fremont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/213,997

(22) Filed: Mar. 26, 2021

(51) Int. Cl.
*G11C 7/00* (2006.01)
*G11C 16/32* (2006.01)
*G11C 16/26* (2006.01)
*G11C 16/04* (2006.01)

(52) U.S. Cl.
CPC .......... *G11C 16/32* (2013.01); *G11C 16/0483* (2013.01); *G11C 16/26* (2013.01)

(58) Field of Classification Search
CPC ....... G11C 7/1051; G11C 7/22; G11C 7/1072; G11C 7/1006; G11C 7/1066
USPC ....................................... 365/189.15, 189.14
See application file for complete search history.

(56) References Cited

U.S. PATENT DOCUMENTS

| | | | |
|---|---|---|---|
| 9,009,568 B2 | 4/2015 | Luo et al. | |
| 9,318,210 B1 | 4/2016 | Hart et al. | |
| 9,715,937 B1* | 7/2017 | Pang ...................... | G11C 16/26 |
| 10,068,657 B1 | 9/2018 | Yu et al. | |
| 10,559,370 B2 | 2/2020 | Yang et al. | |
| 10,636,498 B1 | 4/2020 | Lien et al. | |
| 2020/0005846 A1* | 1/2020 | Liu ..................... | H01F 10/3254 |

* cited by examiner

*Primary Examiner* — Son T Dinh
(74) *Attorney, Agent, or Firm* — Vierra Magen Marcus LLP

(57) ABSTRACT

Apparatuses and techniques are described for recovering from errors in a read operation. When a read operation results in an uncorrectable read error, recovery read operations are performed for each read voltage of a page of data. Each recovery read operation uses a different timing. The different timings can involve a time period which is allocated for a voltage transition, such as a settling time of a word line or bit line voltage, or a time allocated for an under kick or over kick of a word line or bit line voltage. An error count is obtained for each different timing, and an optimum timing is determined based on the lowest error count. A retry read operation is performed in which an optimum timing is used for the voltage transition for each read voltage of the page.

20 Claims, 24 Drawing Sheets

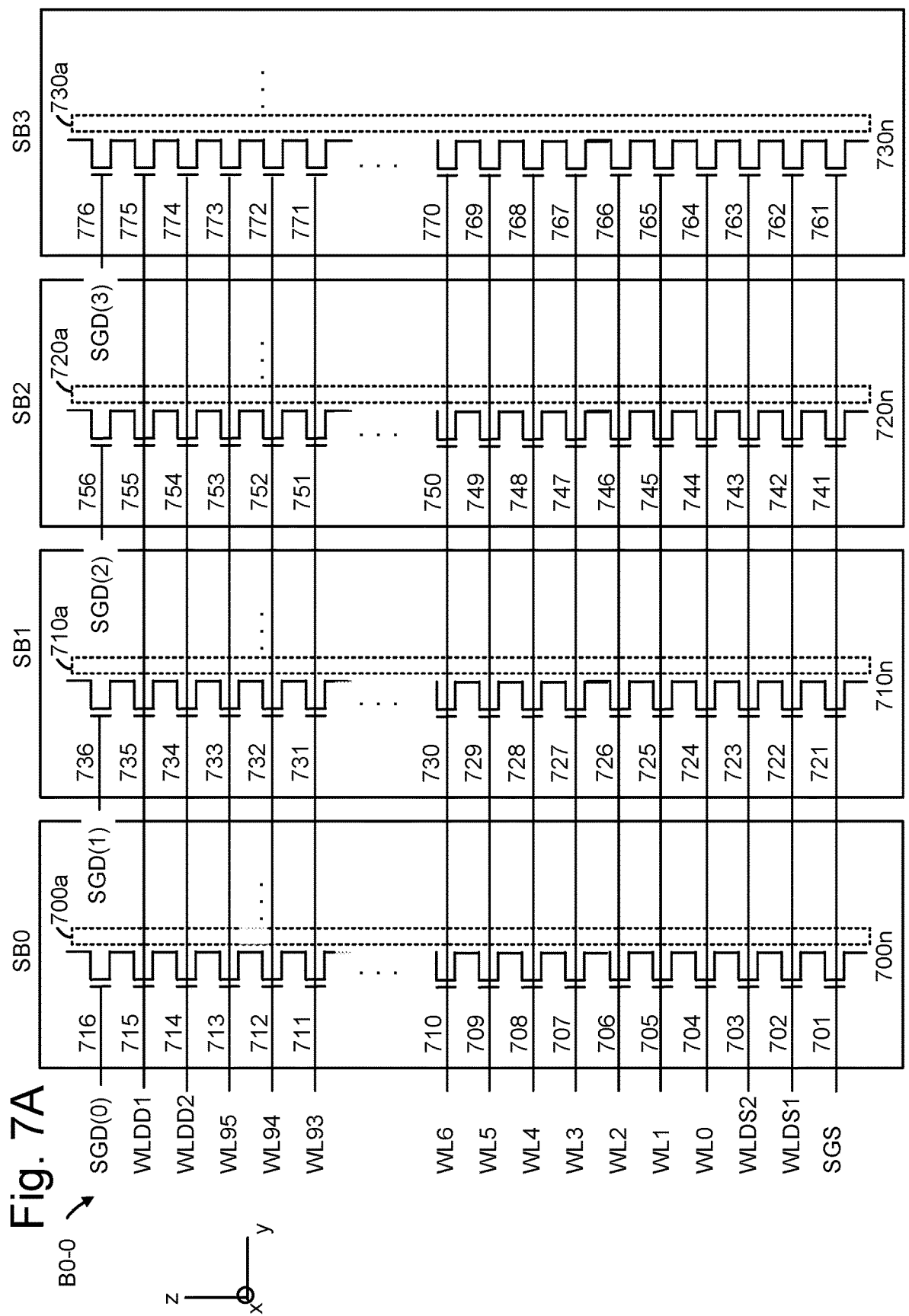

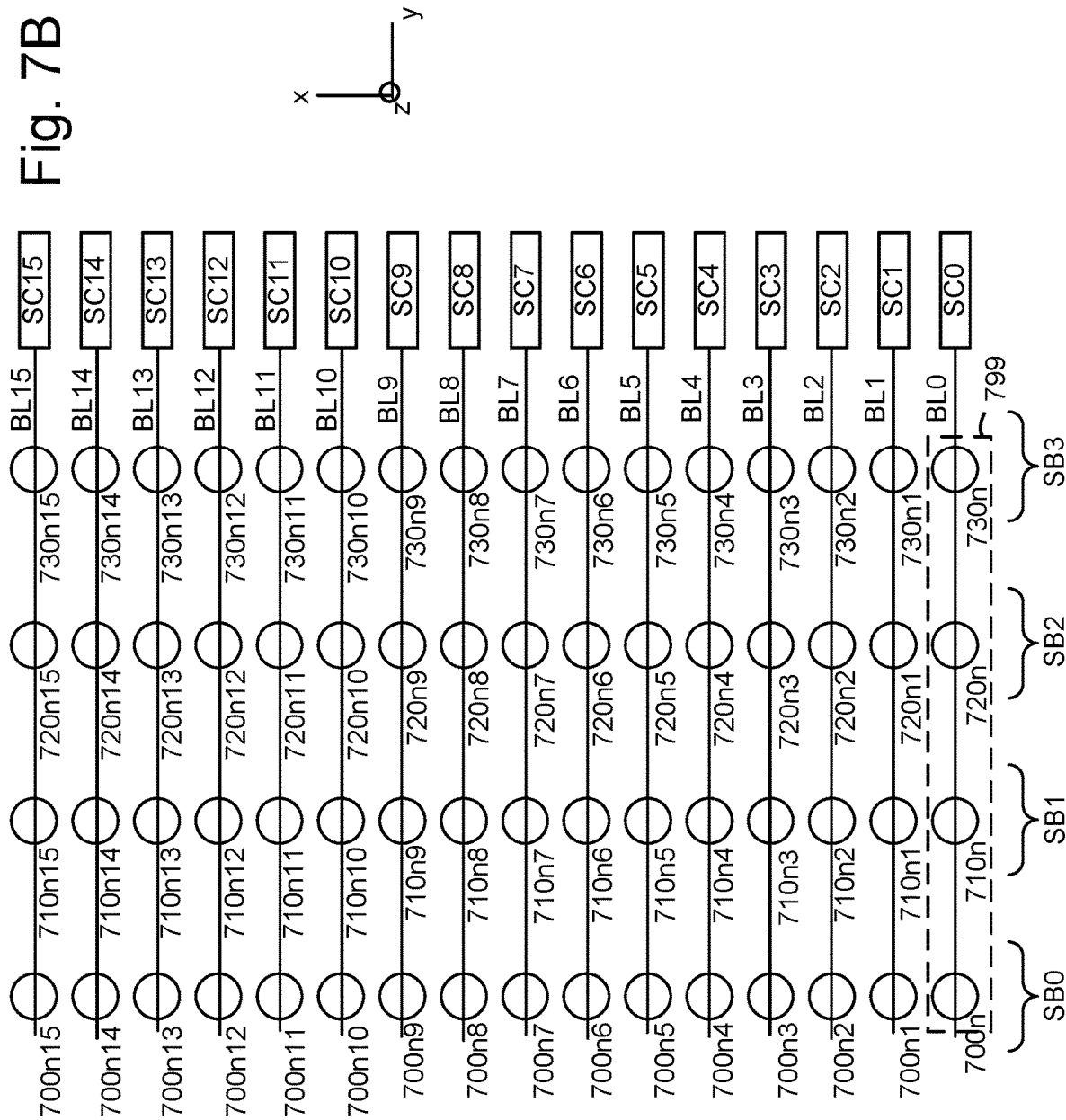

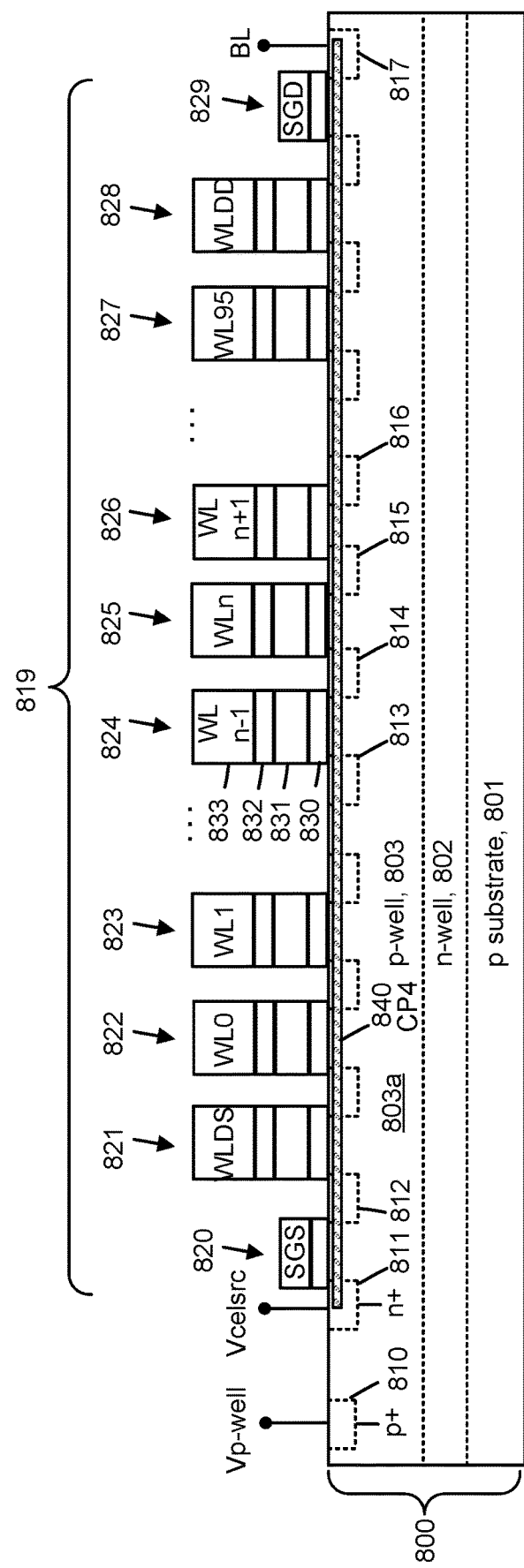

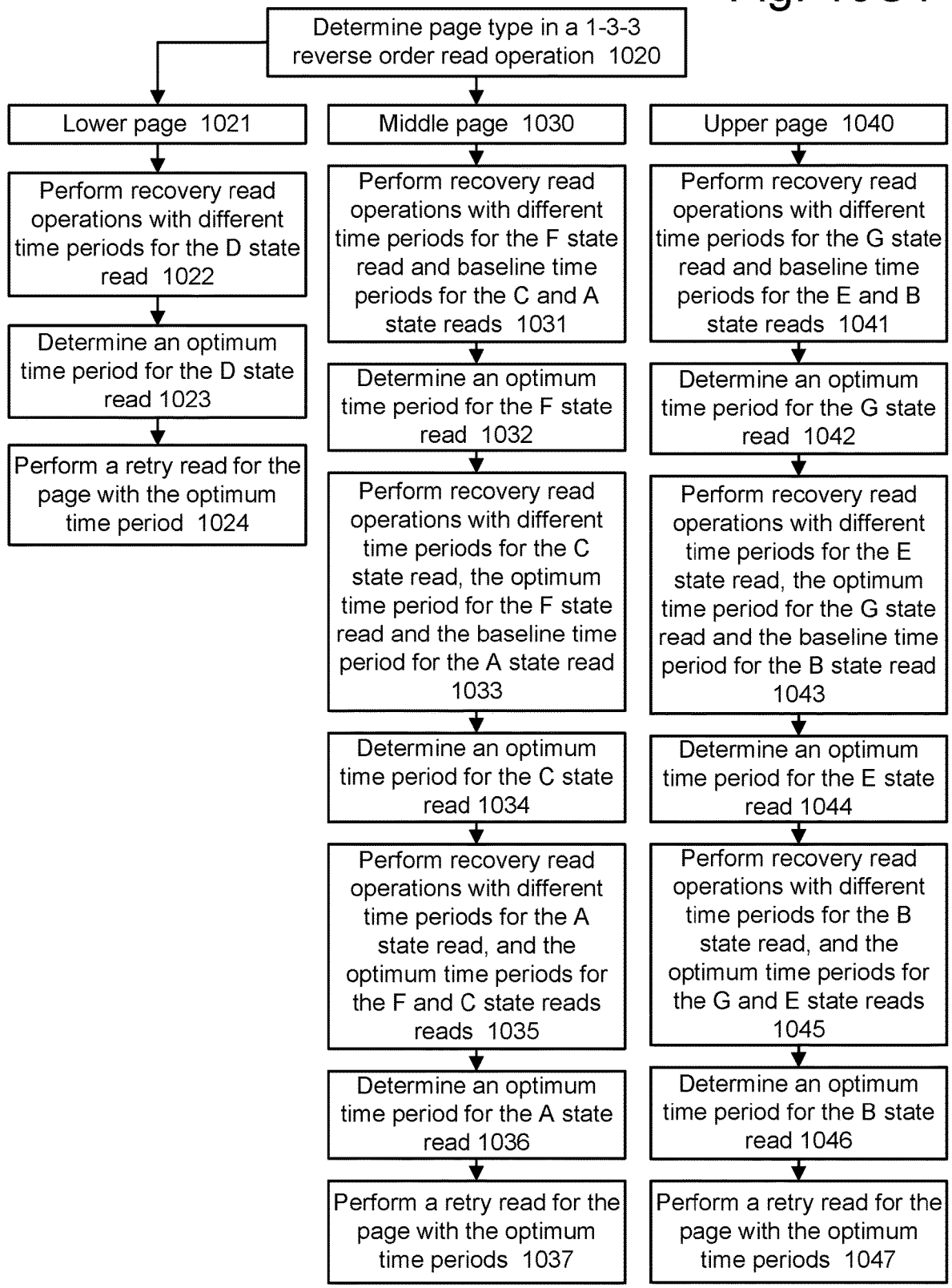
Fig. 10C1

Fig. 10C2

Lower page read recovery operations
D state read
1. t3 to tsenD-Δ
2. t3 to tsenD BTP
3. t3 to tsenD+Δ
4. t3 to tsenD+2Δ
5. t3 to tsenD+3Δ
6. t3 to tsenD+4Δ
7. t3 to tsenD+5Δ

Fig. 10C3

Middle page read recovery operations

| F state read | C state read | A state read |
|---|---|---|
| 1. t3 to tsenF-Δ | t6 to tsenC BTP | t9-tsenA BTP |
| 2. t3 to tsenF BTP | " | " |
| 3. t3 to tsenF+Δ | " | " |
| 4. t3 to tsenF+2Δ | " | " |
| 5. t3 to tsenF+3Δ | | |
| 6. t3 to tsenF+4Δ | | |
| 7. t3 to tsenF+5Δ | | |
| 8. t3 to tsenF opt | t6 to tsenC-Δ | t9-tsenA BTP |
| 9. | t6 to tsenC BTP | " |
| 10. | t6 to tsenC+Δ | " |
| 11. | t6 to tsenC+2Δ | " |
| 12. | t6 to tsenC+3Δ | |
| 13. | t6 to tsenC+4Δ | |
| 14. | t6 to tsenC+5Δ | |
| 15. t3 to tsenF opt | t6 to tsenC opt | t9 to tsenA-Δ |
| 16. " | " | t9 to tsenA BTP |
| 17. " | " | t9 to tsenA+Δ |
| 18. " | " | t9 to tsenA+2Δ |
| 19. " | " | t9 to tsenA+3Δ |
| 20. " | " | t9 to tsenA+4Δ |
| 21. " | " | t9 to tsenA+5Δ |

Fig. 10C4

| Upper page read recovery operations | | |
|---|---|---|
| G state read | E state read | B state read |
| 1. t3 to tsenG-Δ | t6 to tsenE BTP | t9-tsenB BTP |
| 2. t3 to tsenG BTP | " | " |
| 3. t3 to tsenG+Δ | " | " |
| 4. t3 to tsenG+2Δ | " | " |
| 5. t3 to tsenG+3Δ | " | " |
| 6. t3 to tsenG+4Δ | " | " |
| 7. t3 to tsenG+5Δ | " | " |
| 8. t3 to tsenG opt | t6 to tsenE-Δ | t9-tsenB BTP |
| 9. | t6 to tsenE BTP | " |
| 10. | t6 to tsenE+Δ | " |
| 11. | t6 to tsenE+2Δ | " |
| 12. | t6 to tsenE+3Δ | " |
| 13. | t6 to tsenE+4Δ | " |
| 14. | t6 to tsenE+5Δ | " |
| 15. t3 to tsenG opt | t6 to tsenE opt | t9 to tsenB-Δ |
| 16. | " | t9 to tsenB BTP |
| 17. | " | t9 to tsenB+Δ |
| 18. | " | t9 to tsenB+2Δ |
| 19. | " | t9 to tsenB+3Δ |
| 20. | " | t9 to tsenB+4Δ |
| 21. | " | t9 to tsenB+5Δ |

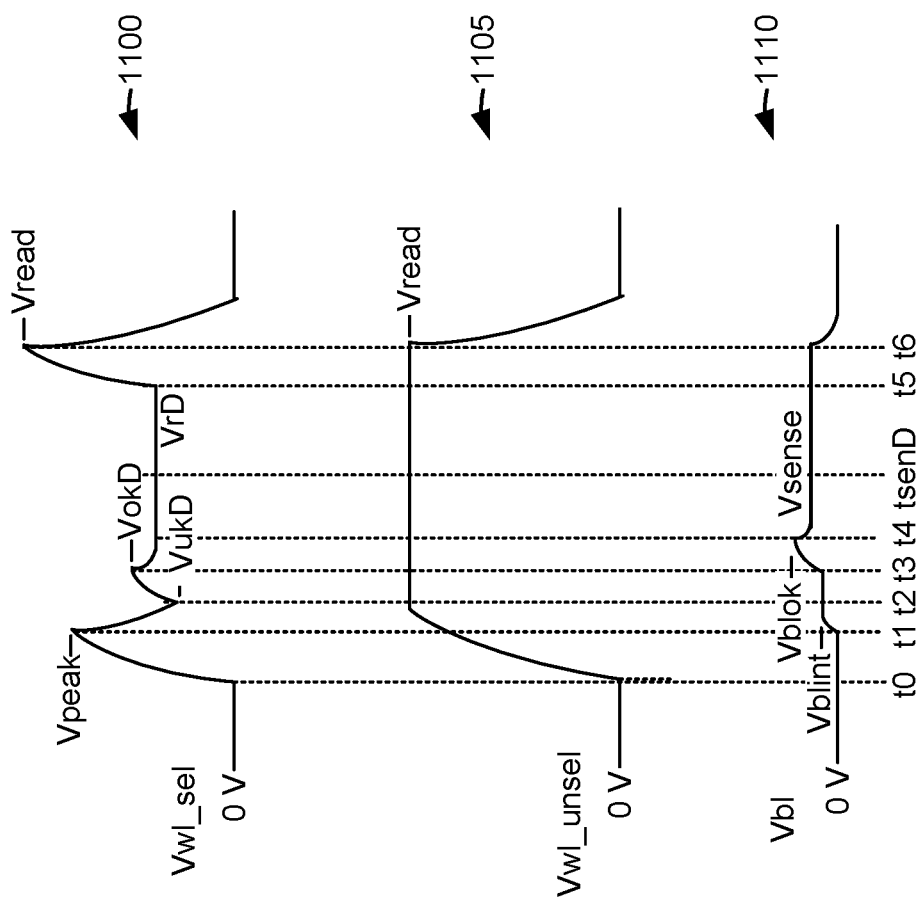

| Address | Byte | Definition |
|---|---|---|
| YYh | B0 | Vwl_sel kick timing step size |
| | B1 | Vwl_sel kick timing step multiplier |
| | B2 | Vwl_sel settling timing step size |
| | B3 | Vwl_sel settling timing step multiplier |
| | B4 | Vbl kick timing step size |
| | B5 | Vbl kick timing step multiplier |
| | B6 | Vbl settling timing step size |
| | B7 | Vbl settling timing step multiplier |

TECHNIQUE FOR ADJUSTING READ TIMING PARAMETERS FOR READ ERROR HANDLING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 7A depicts an example view of NAND strings in the block B0-0 which is consistent with FIGS. 4 and 6A.

FIG. 7B depicts an example top view of the block B0-0 of FIG. 7A, with respective NAND strings, bit lines and sense circuits.

FIG. 8 depicts an example NAND string in a 2D configuration.

FIG. 10C1 depicts a flowchart of an example process for implementing the process of FIG. 10B in a 1-3-3 reverse order read operation.

FIG. 10C2 depicts example recovery read operations for a lower page of data, consistent with FIGS. 10C1 and 11A.

FIG. 10C3 depicts example recovery read operations for a middle page of data, consistent with FIGS. 10C1 and 11B.

FIG. 10C4 depicts example recovery read operations for an upper page of data, consistent with FIGS. 10C1 and 11C.

FIG. 11A depicts example voltage signals consistent with the lower page read of FIG. 10C1.

DETAILED DESCRIPTION

Apparatuses and techniques are described for recovering from errors in a read operation.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. For example, see FIG. 7A. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. For example, see the channel 660 and charge-trapping layer 664 in the NAND string 700$n$ in FIG. 6A. A source end 700$s$ of the NAND string is connected to the substrate 611 and a drain end 700$d$ of the NAND string is connected to a bit line, BL0. For example, see FIG. 6A.

In particular, 3D NAND flash memory is widely used for storage in consumer devices, enterprise systems and industrial applications because of its non-volatility, affordability, high storage density and high access speed.

In a 2D memory structure, the memory cells may be arranged in horizontal NAND strings on a substrate.

Figure 9A:
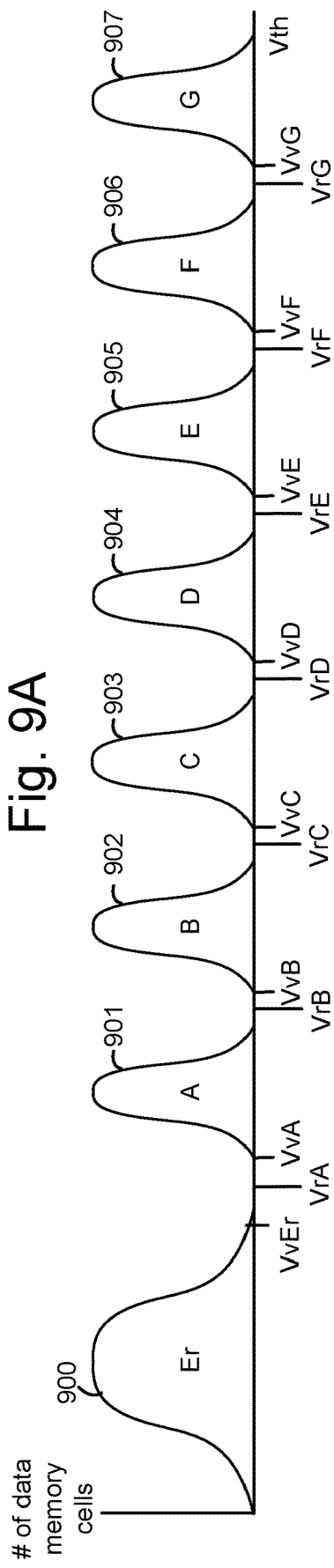
FIG. 9A depicts threshold voltage (Vth) distributions for data memory cells in an eight-state memory device.

Data can be stored in the memory cells by programming them to different data states which are represented by different ranges of threshold voltages. For example, FIG. 9A depicts eight different data states which can be used in a three-bit per cell approach. Generally, one or more bits can be stored in each memory cell. The data can be arranged in pages, where a page is a minimum unit of data which can be programmed or read. In one approach, each bit stored in a cell is in a different page of data. For example, with three bits per cell, a lower, middle and upper page can be stored. To read a page, the memory cells are read relative to one or more read voltages of the page. In some cases, an error correction code (ECC) is used to correct a small number of read errors.

However, various types of defects can occur in a memory device which prevent the data from being read back correctly. For example, extrinsic defect related failures can include a short circuit between word lines and a short circuit between a word line and a memory hole in a 3D NAND string. Additionally, intrinsic degradation related failures, such as read disturb, program disturb and data retention loss, can worsen as the memory device ages and wears down with each program-erase cycle. A failure can be classified as an erase failure, a program failure and a read failure. A read failure is most serious from a system perspective since it results in loss of the user's data.

One type of defect which can cause read errors involves an increasing resistance-capacitance (RC) on a word line which worsens over time. This can involve a highly resistive interfacial layer formed between a via and a metal. This type of defect may not be present at the time manufacture. Further, the defect may not be detected at the time of programming in a post-write read operation which confirms that the data was written correctly. Once the memory cells are read some time later, however, the defect may prevent a correct read back of the data.

One countermeasure to this problem involves testing the memory devices in cold temperatures when the defect is most likely to occur. However, this can result in overclassifying the memory devices as being defective. Also, this testing capability is time-consuming and may not be available in some manufacturing facilities.

Another countermeasure is to re-read the memory device with different read voltage levels on the word line. However, this does not address the issue of an increasing RC which affects the timing of the voltages used in the read operation.

Techniques provided herein address the above and other issues. In one aspect, when a read operation results in an uncorrectable read error, a plurality of recovery read operations are performed for each read voltage of a page of data, where each recovery read operation uses a different timing for a voltage which is applied in the read operation. For example, the voltage can be a word line voltage or a bit line voltage. The different timings can involve a time period which is allocated for a voltage transition. The time period can be, e.g., a settling time of the word line or bit line, or a time allocated for an under kick or over kick of the voltage. An under kick or over kick is used to provide a faster voltage transition for the far and near side of word line voltage driver to achieve a same target voltage more quickly, and involves driving the voltage lower or higher, respectively, than the desired final level. For example, in FIG. 11B, the word line voltage transitions from VrF to VrC using an under kick which reaches a minimum level, VukC. in FIG. 13A, the word line voltage transitions from 0 V to VrA using an over kick which reaches a peak level, VokA. It is also possible to have an under kick adjacent to an over kick such as in FIG. 11A, where the word line voltage transitions from Vpeak to VukD in an under kick and then to VokD in an over kick, and then to the desired final level of VrD.

Figures 14, 15:
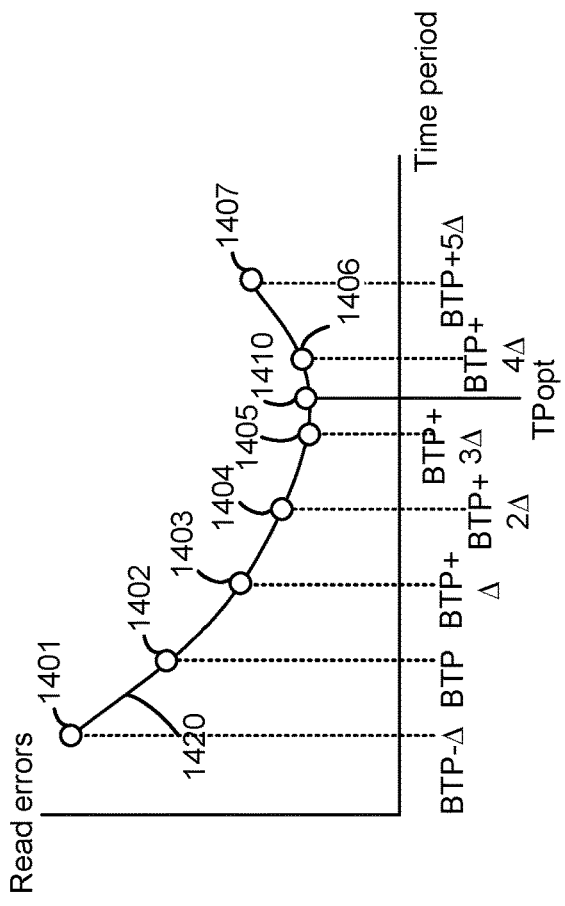
FIG. 14 depicts a plot of read errors versus time period for a voltage applied in different recovery read operations, consistent with step 1002 of FIG. 10A.
FIG. 15 depicts a table of commands for implementing different recovery read operations, consistent with the read timing table 112a of FIG. 1A and with step 1002 of FIG. 10A.

An error count can be obtained for each different timing, and an optimum timing can be determined based on the lowest error count, such as depicted in FIG. 14.

When the page read involves multiple read voltages, such as first and second read voltages, the recovery read operations relative to the first read voltage use different timings while a baseline timing is used for the second read voltage, in one approach. Once an optimum timing is determined for reading the page relative to the first read voltage, a plurality of recovery read operations are performed for reading the memory cells relative to the second read voltage. During these recovery read operations, the previously-determined optimum timing is used for reading the memory cells relative to the first read voltage. At the conclusion of the process, a retry read operation can be performed in which an optimum timing is used for a voltage transition for each read voltage of the page.

For example, in FIG. 14, BTP refers to a baseline timing or time period for a voltage transition. Seven recovery read operations are performed using the baseline time period (BTP), one time period (BTP−Δ) which is shorter than the baseline time period, and five time periods (BTP+Δ to BTP+5Δ) which are longer than the baseline time period. The increments between the time periods can be equal, as in this example, or unequal. In one approach, the optimum time period, TPopt, is set to the time period which results in the lowest read error count, e.g., BTP+3Δ. In another approach, TPopt is obtained by interpolating between the time periods which result in the two smallest number of errors, e.g., between BTP+3Δ and BTP+4Δ.

The recovery read operations provide an "on the fly" adjustment of the read timing to handle read errors. The operations can be performed in the field, when the memory device is in the hands of the end user. The recovery read operations can be implemented in firmware and used as a supplementary technique when uncorrectable read errors occur during baseline read operations. The techniques can be used with one or more bits per cell, normal order read operations, such as in FIG. 13A, where the read voltages are applied starting from the lowest voltage and ending with the highest voltage, and reverse order read operations, such as in FIG. 11B, where the read voltages are applied starting from the highest voltage and ending with the lowest voltage.

These and other features are discussed further below.

Figure 1A:
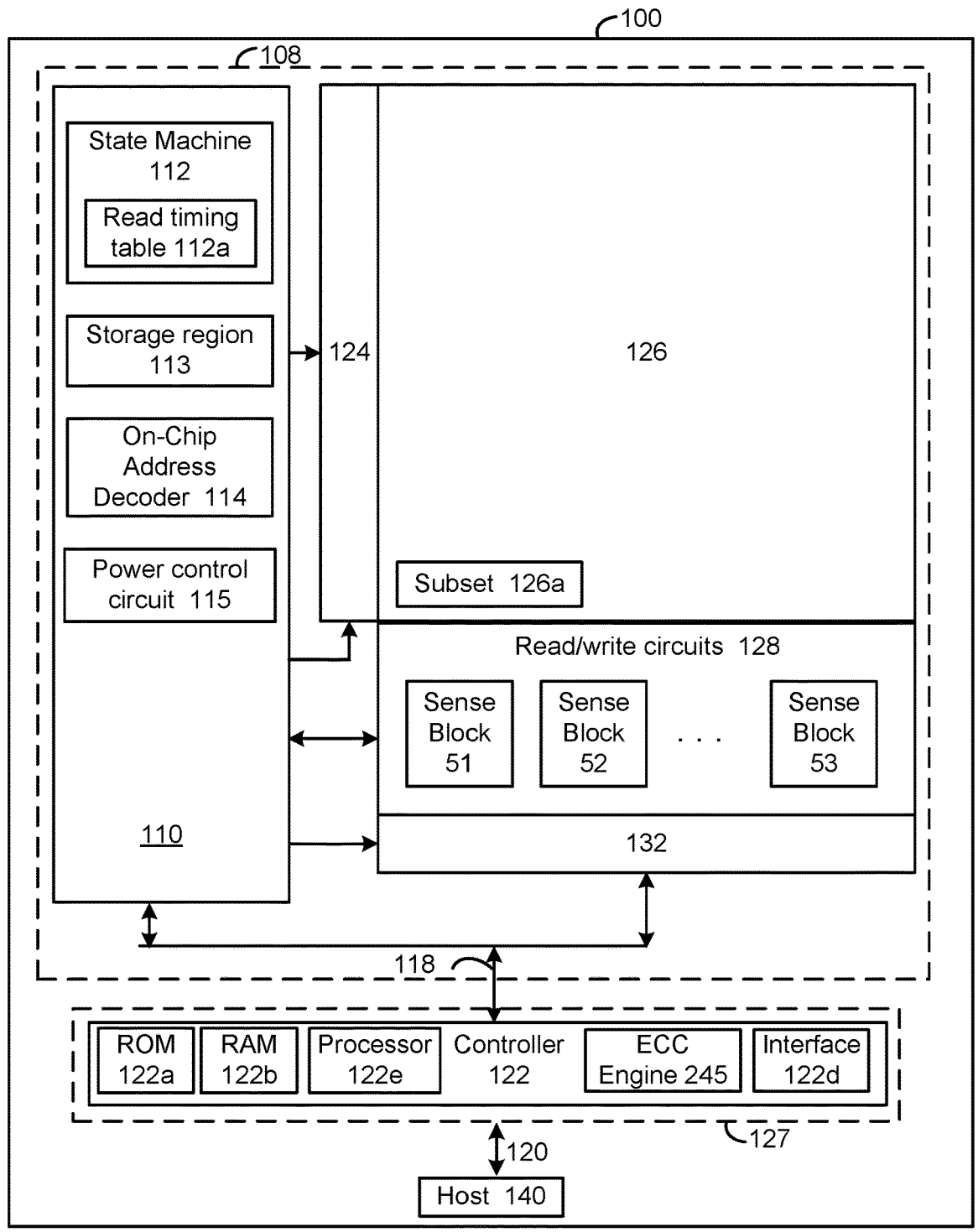
FIG. 1A is a block diagram of an example memory device.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, including a read timing table 112a (see FIG. 15), an on-chip address decoder 114, and a power control circuit 115.

A storage region 113 may also be provided, e.g., for operational parameters and software/code. In one embodiment, the state machine is programmable by the software. In other embodiments, the state machine does not use software and is completely implemented in hardware (e.g., electrical circuits). The storage region 113 can be used to store optimum time periods which are determined in recovery read operations as described herein.

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. In some cases, uncorrectable read errors can occur which trigger recovery read operations as described herein. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 8. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
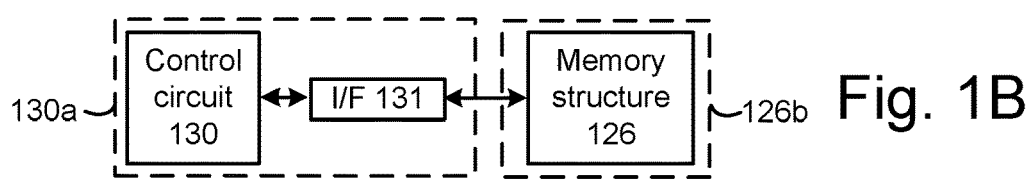
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

Figure 2:
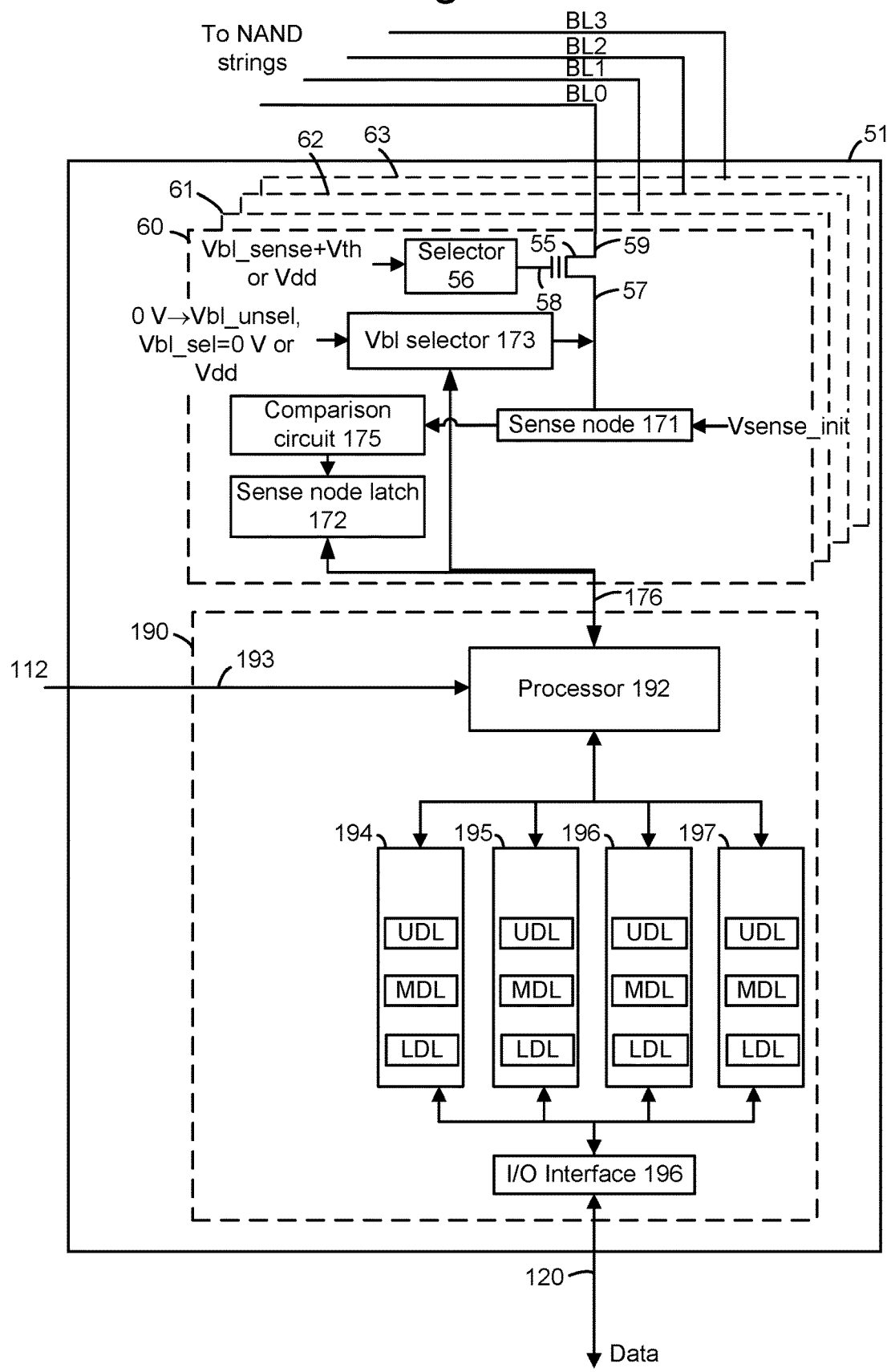
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation, or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
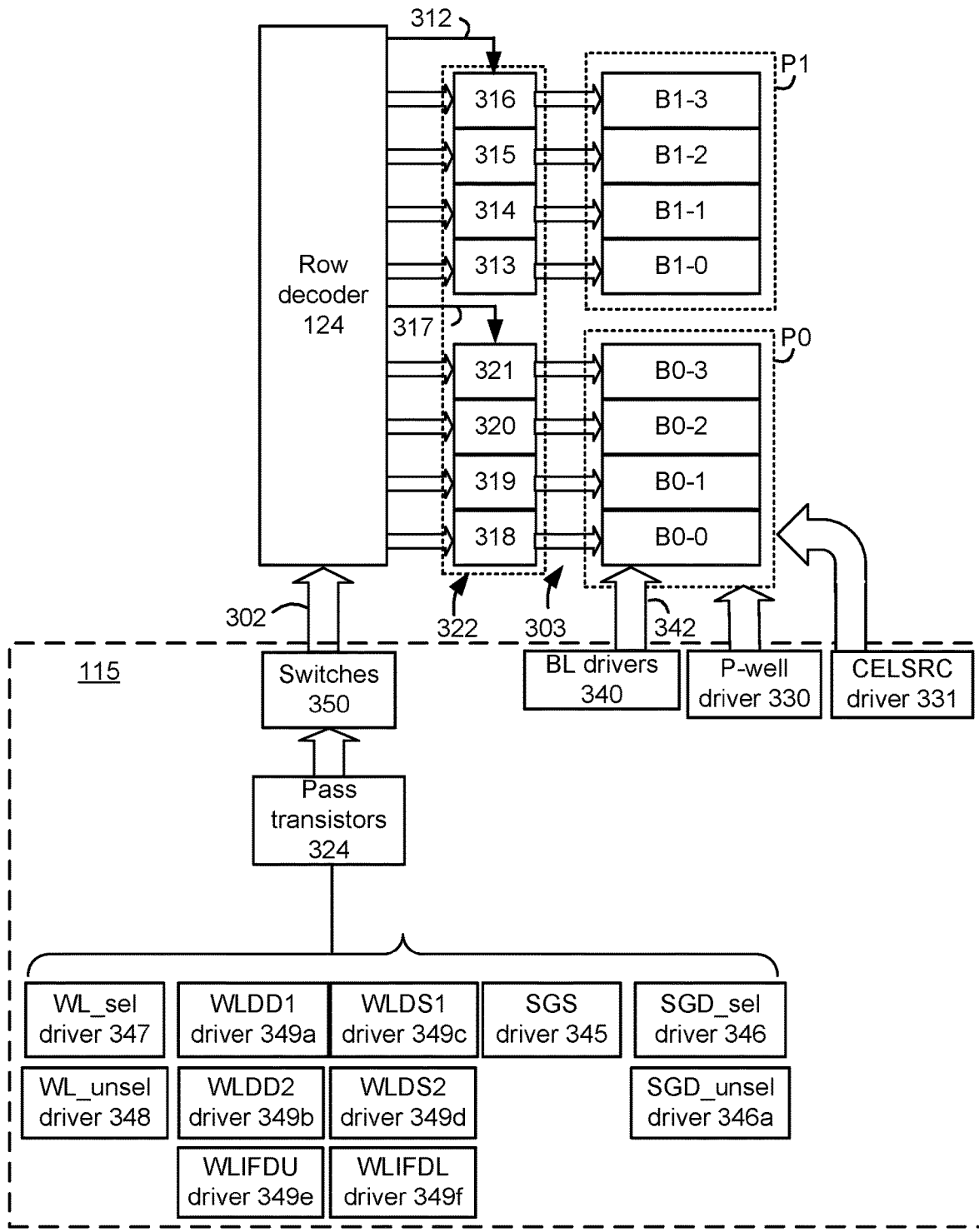
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. As described herein, time periods which are allocated for various transitions in voltages can be optimized, e.g. for the WL_sel driver 347 and the BL voltage drivers 340.

The WL_unsel driver 348 provides a voltage signal on unselected data word lines. A number of drivers for dummy word lines can also be provided. For example, WLDD1, WLDD2, WLDS1, WLDS2, WLIFDU and WLIFDL drivers 349a-349f, respectively, provide a voltage signal on the first drain-side dummy word line WLDD1, the second drain-side dummy word line WLDD2, the first source-side dummy word line WLDS1, the second source-side dummy word line WLDS2, the upper interface dummy word line WLIFDU and the lower interface dummy word line WLIFDL, respectively. See FIGS. 6A and 6B. This is one example, as other examples are possible. In this example, there are two drain-side dummy word lines and two source-side dummy word lines, and two interface dummy word lines, where each dummy word line can receive an independent voltage signal. In another approach, multiple drain-side or source-side dummy word lines have their control gates connected so that they receive a common voltage signal.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 612b in the p-well region 612, e.g., via the conductive path 682. See FIG. 5A. In one approach, the p-well region is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 612c in the p-well region, e.g., via the local interconnect 651 in FIG. 5A.

Bit line (BL) voltage drivers 340 include voltage sources which provide voltages to the bit lines 342. The bit line voltage for sensing can be 0.5 V, for example.

Figure 4:
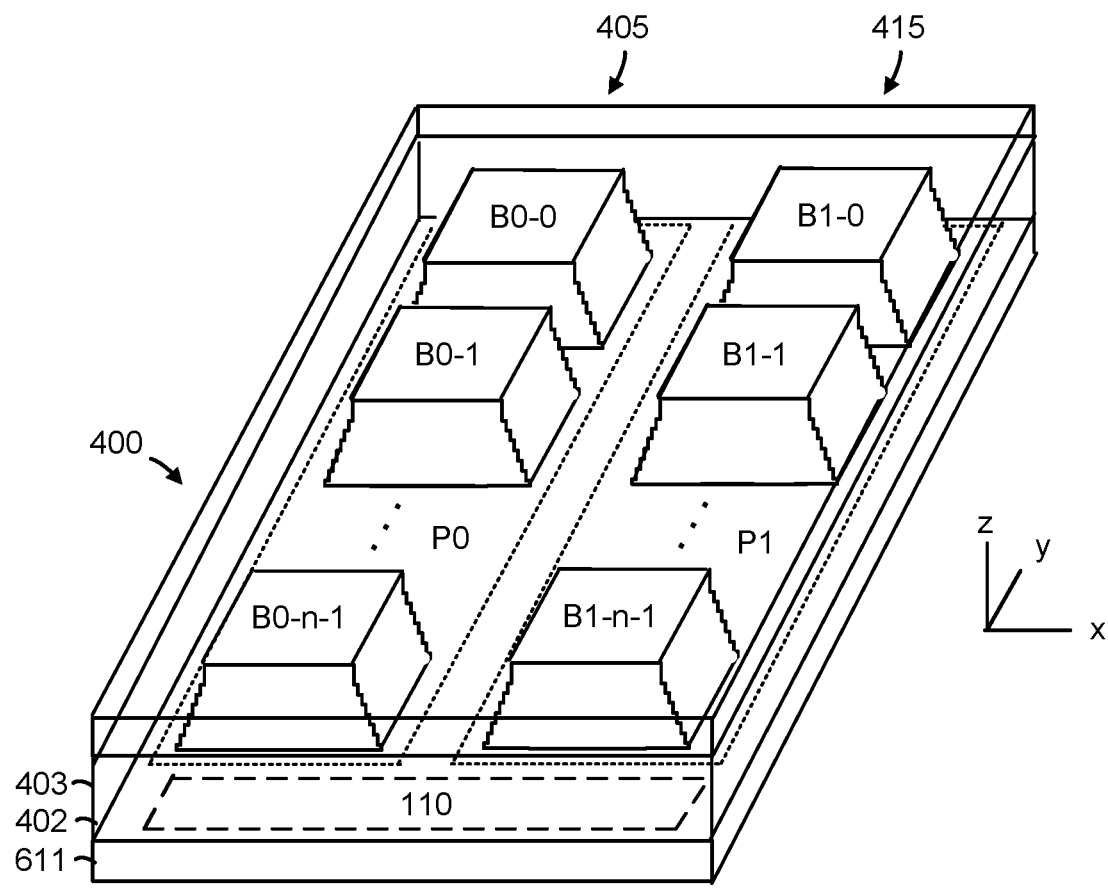
FIG. 4 is a perspective view of an example memory die 400 in which blocks are provided in respective planes P0 and P1, consistent with FIG. 1A.

FIG. 4 is a perspective view of an example memory die 400 in which blocks are provided in respective planes P0 and P1, consistent with FIG. 1A. The memory die includes a substrate 611, an intermediate region 402 in which blocks of memory cells are formed, and an upper region 403 in which one or more upper metal layers are patterned such as to form bit lines. Planes P0 and P1 represent respective isolation regions which are formed in the substrate 611. Further, a first block sequence 405 of a number n blocks, labelled B0-0 to B0-n-1, are formed in P0, and a second block sequence 415 of a number n blocks, labelled B1-0 to B1-n-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erase concurrently.

The substrate 611 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 5:
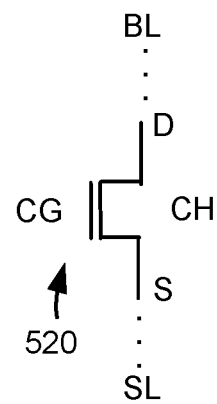
FIG. 5 depicts an example transistor 520 in the memory structure 126 of FIG. 1A.
Figure 6A:
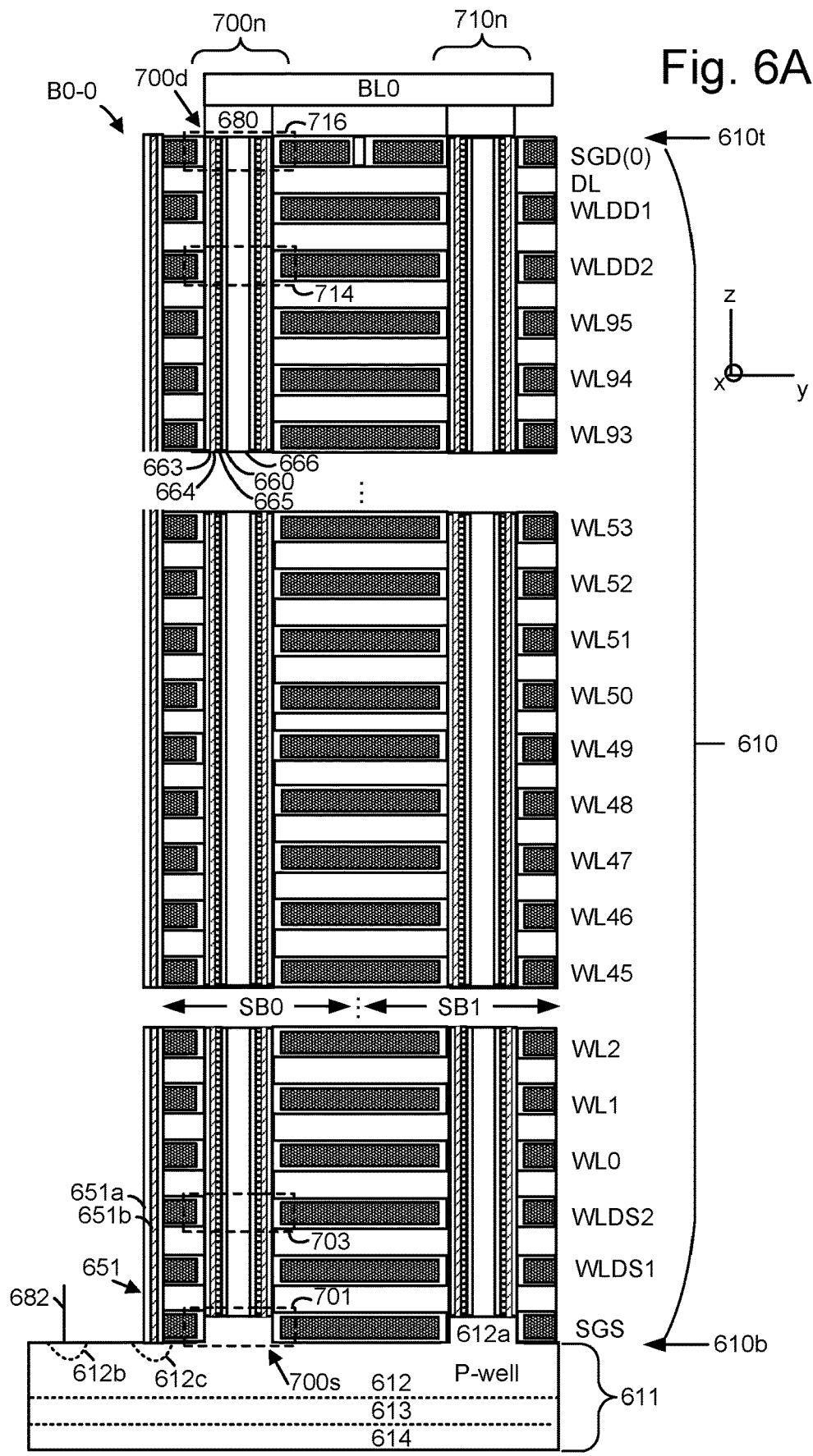
FIG. 6A depicts an example cross-sectional view of a portion of the block B0-0 of FIG. 4, including NAND strings 700n and 710n, in a single-tier stack.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of the block B0-0 of FIG. 4, including NAND strings 700n and 710n, in a single-tier stack. In this example, the NAND strings 700n and 710n are in different sub-blocks SB0 and SB1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 6B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610t and bottom 610b of the stack are depicted. WL95 is the topmost data word line or conductive layer and WL0 is the bottommost data word line or conductive layer in the example herein. However, the total number of WLs could be higher than 96 as BiCS generation evolves.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611a (see also FIG. 3) connected to the source ends of the NAND strings. The p-well region may comprise epitaxial regions 612 which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at atop 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

In this example, the SGS transistors do not include the multiple thin layers 660, 663, 664 and 665. As a result, there is a reduced likelihood of a Vth shift. The verify operations as discussed herein can be omitted for the SGS transistors, in one approach. In another possible approach, the verify operations as discussed herein can be included for the SGS transistors.

Figure 6B:
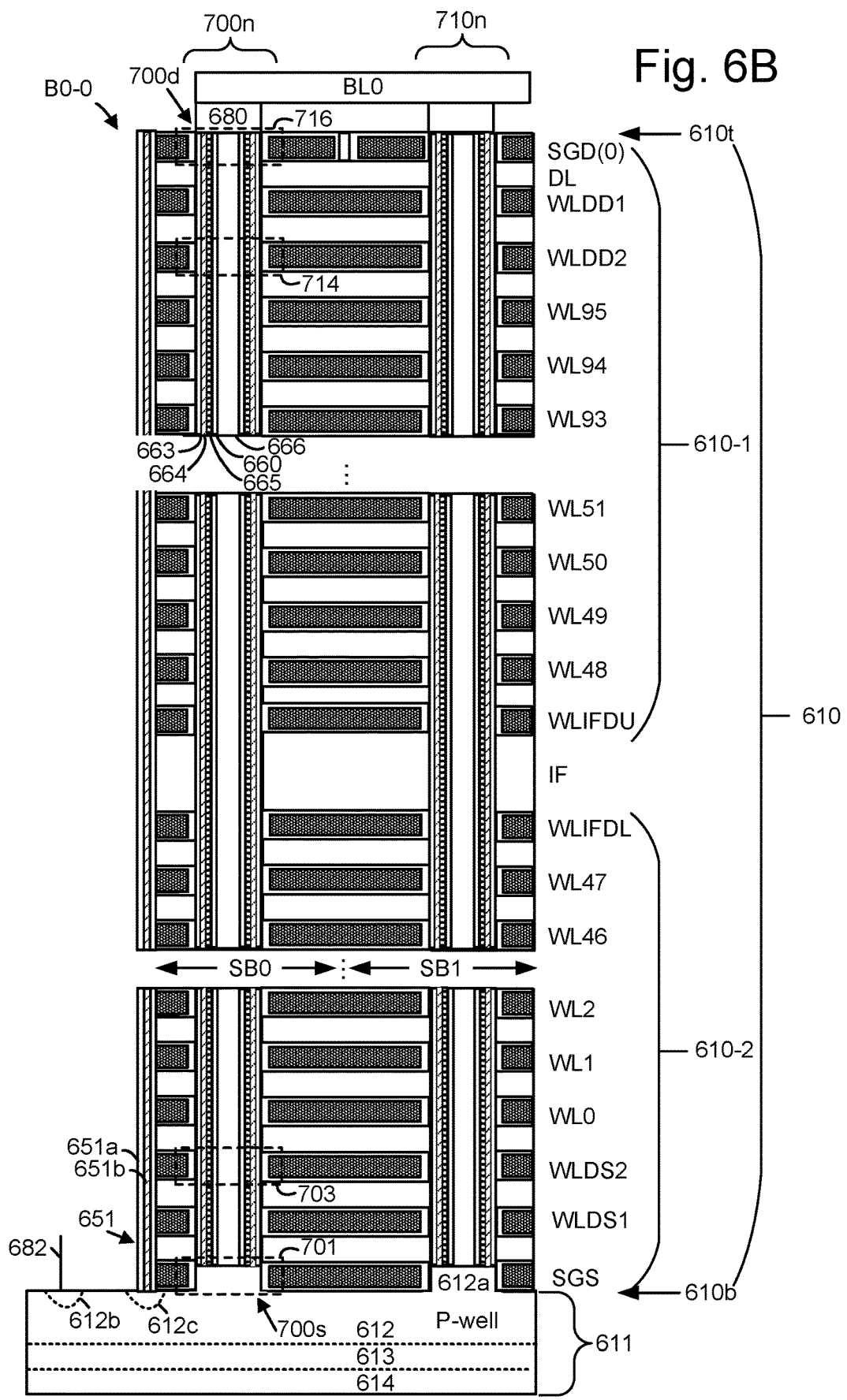
FIG. 6B depicts an example cross-sectional view of a portion of the block B0-0 of FIG. 4, including NAND strings 700n and 710n, in a two-tier stack comprising an upper tier 610-1 and a lower tier 610-2.

FIG. 6B depicts an example cross-sectional view of a portion of the block B0-0 of FIG. 4, including NAND strings 700n and 710n, in a two-tier stack comprising an upper tier 610-1 and a lower tier 610-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

FIG. 7A depicts an example view of NAND strings in the block B0-0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of B0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, source-side dummy memory cells 702 and 703, data memory cells 704-713, drain-side dummy memory cells 714 and 715 and SGD transistor 716. NAND string 710n includes SGS transistor 721, source-side dummy memory cells 722 and 723, data memory cells 724-733, drain-side dummy memory cells 734 and 735 and SGD transistor 736. NAND string 720n includes SGS transistor 741, source-side dummy memory cells 742 and 743, data memory cells 744-753, drain-side dummy memory cells 754 and 755 and SGD transistor 756. NAND string 730n includes SGS transistor 761, source-side dummy memory cells 762 and 763, data memory cells 764-773, drain-side dummy memory cell 774 and 775 and SGD transistor 776.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD (2) and SGD(3), respectively, in one approach.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

FIG. 8 depicts an example NAND string in a 2D configuration. The recovery read techniques discussed herein can be used in a 2D memory device as well as the above-described 3D memory device. The channel in a 2D memory device extends horizontally in the substrate rather than in a vertically extending channel layer. In this example, a substrate 800 includes a p-well 803 within an n-well 802, which in turn is in a p substrate 801. Vp-well and Vcelsrc are provided to the p-well via contacts 810 and 811, respectively. The contact 811 is a source line. The erase pulse can be Vp-well. A NAND string 819 is arranged on the substrate and include select gate transistors and memory cells. For example, the NAND string includes a SGS transistor 820, memory cells 821, 822 and 823 connected to WLDS, WL0 and WL1, respectively, memory cells 824, 825 and 826 connected to WLn−1, WLn and WLn+1, respectively, memory cells 827 and 828 connected to WL95 and WLDD, respectively, and a SGD transistor 829. Doped regions in the substrate, such as example doped regions 811-817, act as sources and drains of the transistors. Vbl is provided to the doped region 817. When appropriate voltages are provided to the NAND string, an inversion layer or channel 840 is formed in the p-well. A remaining portion 803a of the p-well is biased at Vp-well.

The example memory cell 824 comprises a tunneling layer 830, a floating gate layer 831, a blocking oxide layer 832 and a control gate 833.

FIG. 9A depicts threshold voltage (Vth) distributions for data memory cells in an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 900 is obtained, representing the erased state. The erase operation is completed when the Vth of all, or nearly all, of the data memory cells is below a verify voltage, VvEr.

The memory cells are then subject to a programming operation. Each of the memory cells has an assigned data state. Some of the memory cells are assigned to the erased state and are not programmed. Most of the memory cells are programmed to higher states, such as A-F, in this example, as represented by Vth distributions 901-907, respectively. These memory cells are subject to verify tests using verify voltages of VvA-VvG.

The memory cells are then subject to a baseline (non-recovery) read operation using the A-G state read voltages, VrA-VrG, respectively. A read operation occurs for a page of data and involves one or more read voltages. In one approach, consistent with FIGS. 10C1 and 11A-11C, a lower page read involves VrD, a middle page read involves VrF, VrC and VrA, and an upper page read involves VrG, VrE and VrB. In another approach, consistent with FIGS. 10D and 13A-13C, a lower page read involves VrA and VrE, a middle page read involves VrB, VrD and VrF, and an upper page read involves VrC and VrG.

Figure 9B:
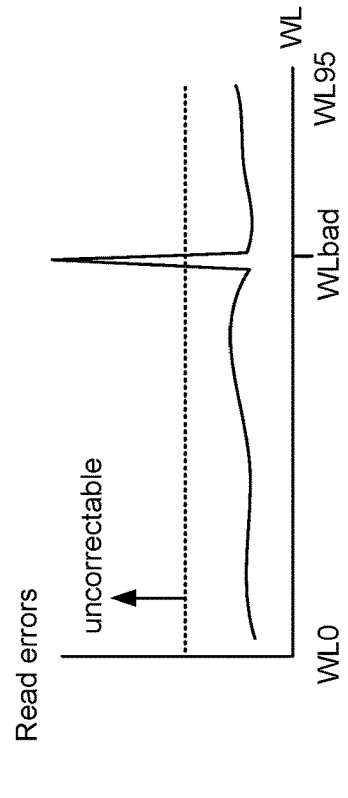
FIG. 9B depicts a plot of read errors versus word line, showing a bad word line, WLbad, having uncorrectable read errors.

FIG. 9B depicts a plot of read errors versus word line, showing a bad word line, WLbad, having uncorrectable read errors. As mentioned at the outset, a defect can occur on a word line which increases its resistance, resulting in uncorrectable read errors. In some cases, the defect is specific to one word line, referred to as WLbad, in a set of word lines WL0-WL95. A number of read errors at or above the level of the dotted line represents uncorrectable read errors. A number of read errors below the level of the dotted line represents correctable read errors. In this example, WLbad clearly has an excessive number of read errors when a baseline read operation is performed.

Instead of counting the number of read errors, a bit error rate or syndrome weight can be used.

Figure 10A:
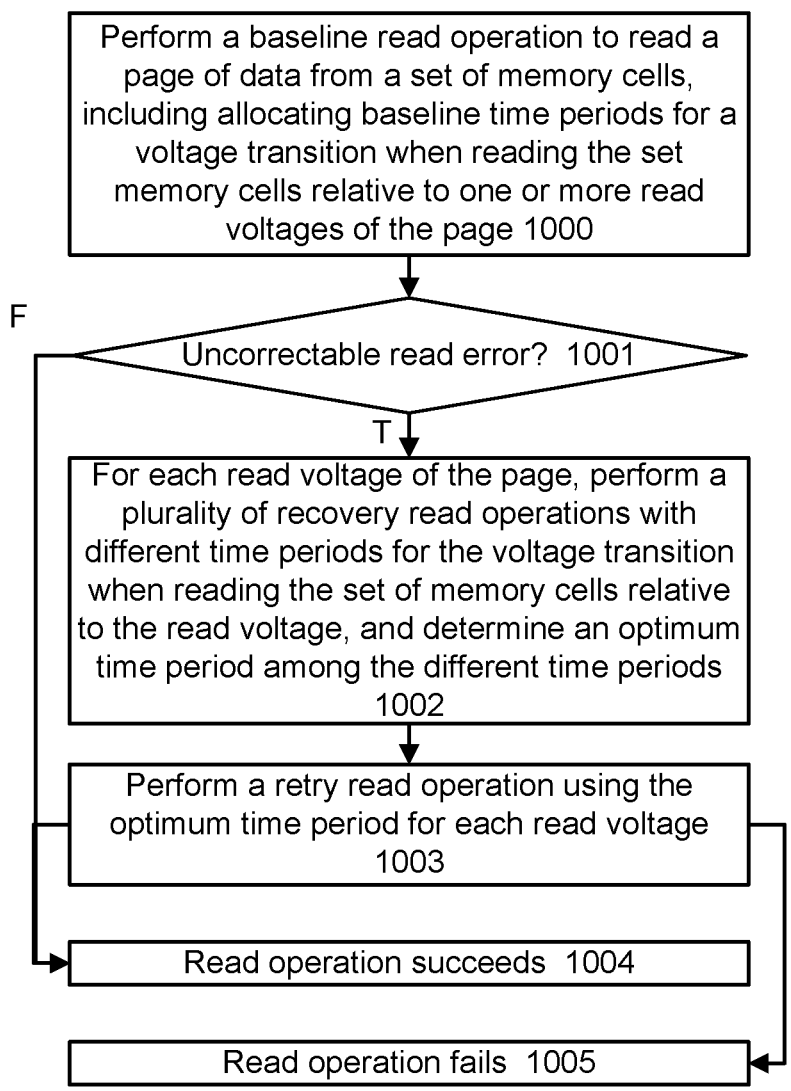
FIG. 10A depicts a flowchart of an example process for recovering from uncorrectable read errors.

FIG. 10A depicts a flowchart of an example process for recovering from uncorrectable read errors. Step 1000 includes performing a baseline read operation to read a page of data from a set of memory cells, including allocating baseline time periods for a voltage transition when reading the set of memory cells relative to one or more read voltages of the page. A baseline read operation is a normal read operation which is performed using baseline time periods for a voltage transition such as for word line and bit line voltages. The baseline read operation can include an ECC decoding process which determines whether there is an uncorrectable read error in the page of data. If there is an uncorrectable read error, a decision step 1001 is true, and step 1002 is reached. If there is no uncorrectable read error, the decision step 1001 is false, and step 1004 is reached, indicating that the read operation has succeeded.

Step 1002 includes, for each read voltage of the page, performing a plurality of recovery read operations with different time periods for a voltage transition when reading the set of memory cells relative to the read voltage, and determining an optimum time period among the different time periods. Various examples are discussed further below. In one approach, an optimum time period is determined for a currently selected read voltage, while an optimum time period is used for one or more previous read voltages of the page, and the baseline time period is used for is used for one or more subsequent read voltages of the page. Step 1003 includes performing a retry read operation using the optimum time period for each read voltage of the page. If the retry operation succeeds, e.g., there are no uncorrectable errors, the read operation succeeds at step 1004. Or, if the retry operation fails, e.g., there are one or more uncorrectable errors, the read operation fails at step 1005.

Figure 10B:
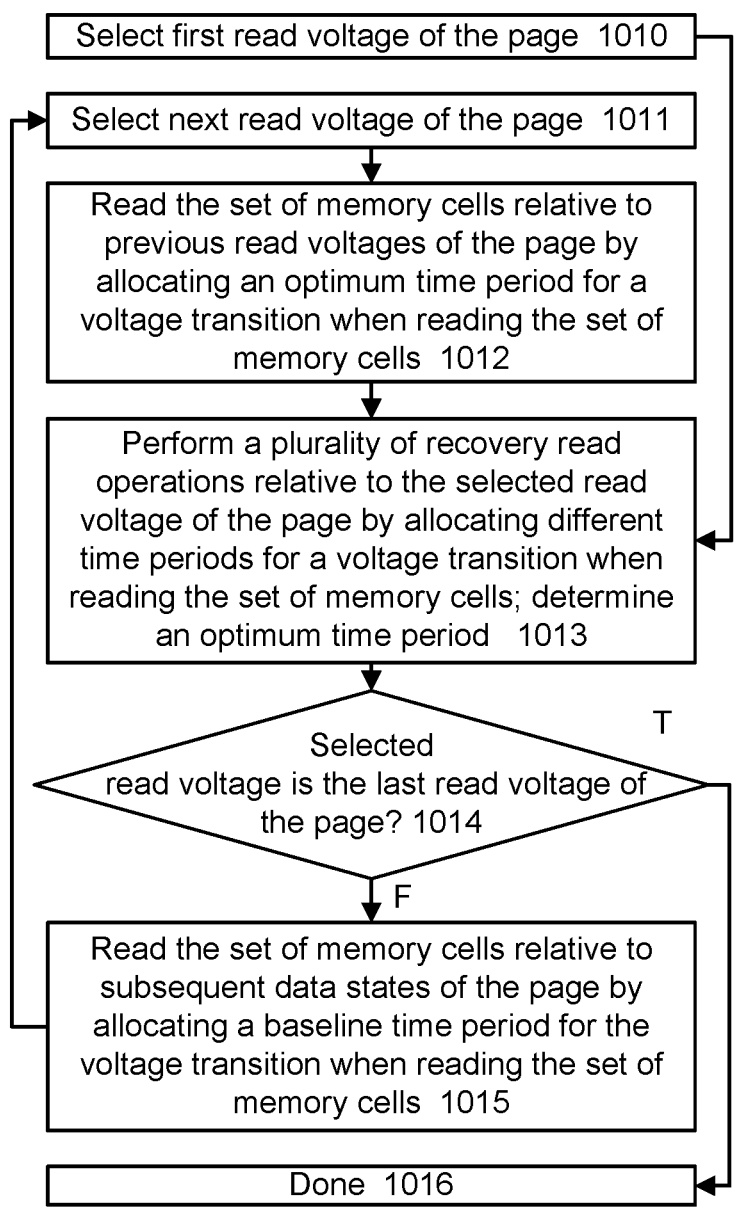
FIG. 10B depicts a flowchart of an example process for implementing step 1002 of FIG. 10A.

FIG. 10B depicts a flowchart of an example process for implementing step 1002 of FIG. 10A. As mentioned, this step involves performing a plurality of recovery read operations for each read voltage of a page. Step 1010 involves selecting the first read voltage of the page. For example, in FIG. 11B, VrF is the first read voltage. Step 1013 involves performing a plurality of recovery read operations relative to the selected read voltage of the page by allocating different time periods for a voltage transition when reading the set of memory cells, and based on the results of the recovery read operations, determining an optimum time period. This is an optimum voltage transition time. For example, this can involve reading the set of memory cells multiple times using a voltage signal similar to that in FIG. 11B, but where a timing of a voltage signal used for the F state read is different each time. For example, a settling time, time for a down kick or time for an up kick from t0-t5 can be different each time. As a specific example, the word line voltage settling time period t3-tsenF can be different in each recovery read operation relative to VrF. As another specific example, the word line over kick time period t2-t3 can be different in each recovery read operation relative to VrF.

Figure 11B:
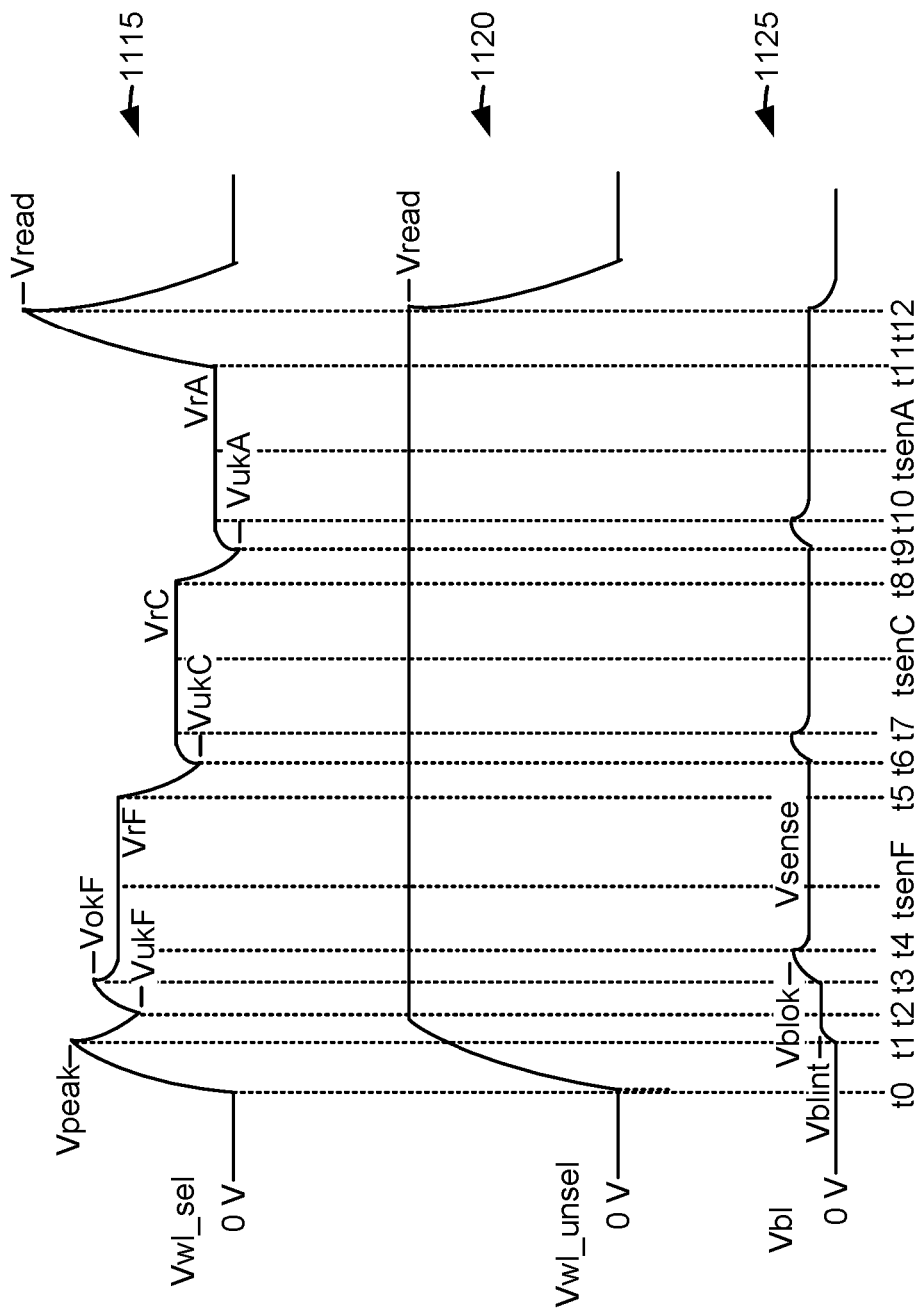
FIG. 11B depicts example voltage signals consistent with the middle page read of FIG. 10C1.

A decision step 1014 determines whether the selected read voltage is the last read voltage of the page. In the example of FIG. 11B, VrF is not the last read voltage of the page so that step 1014 is false, and step 1015 follows. If the decision step 1014 is true, the process is done at step 1016. Step 1015 includes reading the set of memory cells relative to one or more subsequent read voltages of the page by allocating a baseline time period for a voltage transition when reading the set of memory cells. For example, with VrF as the current read voltage, the subsequent read voltages are VrC and VrA in FIG. 11B. The reading relative to VrC occurs from t5-t8 and the reading relative to VrA occurs from t8-t11. As a specific example, a baseline word line voltage settling time period t6-tsenC and t9-tsenA can be used in each recovery read operation relative to VrC and VrA, respectively. These baseline settling time periods for VrC and VrA can be the same or different. As another specific example, a baseline word line under kick time period t5-t6 and t8-t9 can be used in each recovery read operation relative to VrC and VrA, respectively. These baseline under kick time periods for VrC and VrA can be the same or different.

After step 1015, step 1011 is reached where the next read voltage, VrC, is selected. Step 1012 includes reading the set of memory cells relative to one or more previous read voltages of the page, e.g., VrF, by allocating an optimum time period for a voltage transition when reading the set of memory cells. This is the optimum time period determined at step 1013. Step 1013 includes performing a plurality of recovery read operations relative to the selected read voltage of the page, e.g., VrC, by allocating different time periods for a voltage transition when reading the set of memory cells, and based on the results of the recovery read operations, determining an optimum time period. For example, this can involve reading the set of memory cells multiple times using a voltage signal similar to that in FIG. 11B, but where a timing of a voltage signal used for the C state read is different each time. For example, a settling time, time for a down kick or time for an up kick from t5-t8 can be different each time. As a specific example, the word line voltage settling time period t6-tsenC can be different in each recovery read operation relative to VrC. As another specific example, the word line under kick time period t5-t6 can be different in each recovery read operation relative to VrC.

The decision step 1014 determines whether the selected read voltage is the last read voltage of the page. In this example, VrC is not the last read voltage of the page so that step 1014 is false, and step 1015 follows. Step 1015 includes reading the set of memory cells relative to one or more subsequent read voltages of the page by allocating a baseline time period for a voltage transition when reading the set of memory cells. For example, with VrC as the current read voltage, the subsequent read voltage is VrA in FIG. 11B. As a specific example, a baseline word line voltage settling time period t9-tsenA can be used in each recovery read operation relative to VrA. As another specific example, a baseline word line under kick time period t8-t9 can be used in each recovery read operation relative to VrA.

After step 1015, step 1011 is reached again where the next read voltage, VrA, is selected. Step 1012 includes reading the set of memory cells relative to one or more previous read voltages of the page, e.g., VrF and VrC, by allocating an optimum time period for a voltage transition when reading the set of memory cells. Step 1013 includes performing a plurality of recovery read operations relative to the selected read voltage of the page, e.g., VrA, by allocating different time periods for a voltage transition when reading the set of memory cells, and based on the results of the recovery read operations, determining an optimum time period. For example, this can involve reading the set of memory cells multiple times using a voltage signal similar to that in FIG. 11B, but where a timing of a voltage signal used for the A state read is different each time. For example, a settling time, time for a down kick or time for an up kick from t8-t11 can be different each time. As a specific example, the word line voltage settling time period t9-tsenA can be different in each recovery read operation relative to VrA. As another specific example, the word line under kick time period t8-t9 can be different in each recovery read operation relative to VrA.

The decision step 1014 is true since VrA is the last read voltage of the page in this example, and the process is done at step 1016.

For some page reads, there is just one read voltage, such as in FIG. 11A, so there is no previous or subsequent read voltage in the page.

In one approach, the read voltages on the word line, e.g., VrF, VrC and VrA in FIG. 11B, are not changed from their baseline levels during the recovery read operations.

FIG. 10C1 depicts a flowchart of an example process for implementing the process of FIG. 10B in a 1-3-3 reverse order read operation. In a reverse order read operation, such as in FIG. 11B, the read voltages are applied starting from the highest voltage and ending with the lowest voltage. This type of read order may have an under kick voltage when the voltage is reduced from a higher level to a lower level. 1-3-3 refers to 1, 3 and 3 read voltages in the lower, middle and upper pages, respectively.

The example process begins at step 1020, which involves determining the page type in a 1-3-3 reverse order read operation. This is the page type which was found to have an uncorrectable read error. Step 1021 indicates the page type is the lower page. Step 1022 performs recovery read operations with different time periods for the D state read. Step 1023 determines an optimum time period for the D state read. Step 1024 performs a retry read for the page with the optimum time period.

Step 1030 indicates the page type is the middle page. Step 1031 performs recovery read operations with different time periods for the F state read and baseline time periods for the C and A state reads. Step 1032 determines an optimum time period for the F state read. Step 1033 performs recovery read operations with different time periods for the C state read, the optimum time period for the F state read, and the baseline time period for the A state read. Step 1034 determines an optimum time period for the C state read. Step 1035 performs recovery read operations with different time periods for the A state read, and the optimum time periods for the F and C state reads. Step 1036 determines an optimum time period for the A state read. Step 1037 performs a retry read for the page with the optimum time periods.

Step 1040 indicates the page type is the upper page. Step 1041 performs recovery read operations with different time periods for the G state read and baseline time periods for the E and B state reads. Step 1042 determines an optimum time period for the G state read. Step 1043 performs recovery read operations with different time periods for the E state read, the optimum time period for the G state read, and the baseline time period for the B state read. Step 1044 determines an optimum time period for the E state read. Step 1045 performs recovery read operations with different time periods for the B state read, and the optimum time periods for the G and E state reads. Step 1046 determines an optimum time period for the B state read. Step 1047 performs a retry read for the page with the optimum time periods.

In the examples of FIG. 10C1 to 10D, there are seven recovery read operations for each read voltage and the timing which is adjusted is a word line voltage settling time. It is possible for the number of different read recovery operations to different for different read voltages.

In one option, the optimum time period for one state can be used to guide the determination of an optimum time period in another state. For example, for the middle page, the optimum time period for the F state can be used to guide the determination of an optimum time period in the C and/or A states. Referring to FIG. 10C3, assume the optimum time period for the voltage transition in the F state is t3 to tsenF+3Δ. Based on this, the different time periods for the voltage transition of the C state read can be centered around t6 to tsenC+3Δ. For instance, the time periods can range from t6 to tsenC to tsenC+6Δ.

FIG. 10C2 depicts example recovery read operations for a lower page of data, consistent with FIGS. 10C1 and 11A. The seven recovery read operations involve the D state and include settling times ranging from t3 to tsenD−Δ to t3 to tsenD+5Δ. These are examples of different allocated voltage transition times.

FIG. 10C3 depicts example recovery read operations for a middle page of data, consistent with FIGS. 10C1 and 11B. The recovery read operations 1-7 vary the settling times for the F state from (t3 to tsenF−Δ) to (t3 to tsenF+5Δ), while the settling times for the C and A states are at respective baseline levels. The recovery read operations 8-14 vary the settling times for the C state from (t6 to tsenC−Δ) to (t6 to tsenC+5Δ), while the settling time for the C and A states are at optimum (opt) and baseline levels, respectively. The recovery read operations 15-21 vary the settling times for the A state from (t9 to tsenA−Δ) to (t9 to tsenA+5Δ), while the settling time for the F and C states are at respective optimum levels. t3 to tsenF opt is an example of an optimum first time period and t6 to tsenC opt is an example of an optimum second time period.

The value Δ can be different for each state read. For example, three different values of Δ can be used for the F, C and A state reads. In one approach, Δ can be a specified percentage of the corresponding baseline time period. For example, for the F, C and A state reads, Δ can be 5-10% of t3 to tsenF BTP, t6 to tsenC BTP and t9 to tsenA BTP, respectively.

Figure 11C:
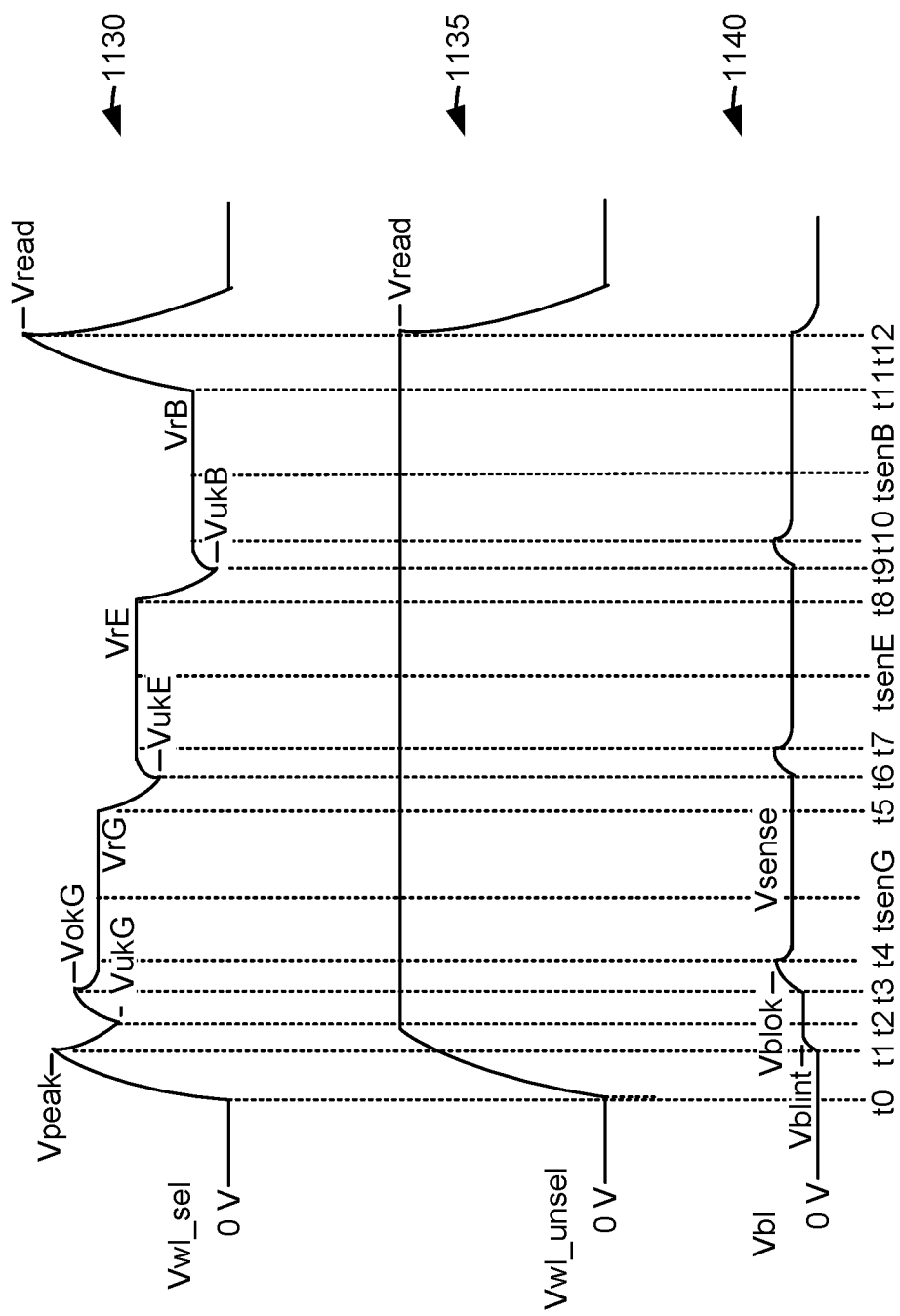
FIG. 11C depicts example voltage signals consistent with the upper page read of FIG. 10C1.

FIG. 10C4 depicts example recovery read operations for an upper page of data, consistent with FIGS. 10C1 and 11C. The recovery read operations 1-7 vary the settling times for the G state from (t3 to tsenG−Δ) to (t3 to tsenG+5Δ), while the settling times for the E and B states are at respective baseline levels. The recovery read operations 8-14 vary the settling times for the E state from (t6 to tsenE−Δ) to (t6 to tsenE+5Δ), while the settling time for the E and B states are at optimum (opt) and baseline levels, respectively. The recovery read operations 15-21 vary the settling times for the B state from (t9 to tsenB−Δ) to (t9 to tsenB+5Δ), while the settling time for the G and E states are at respective optimum levels.

Figure 10D:
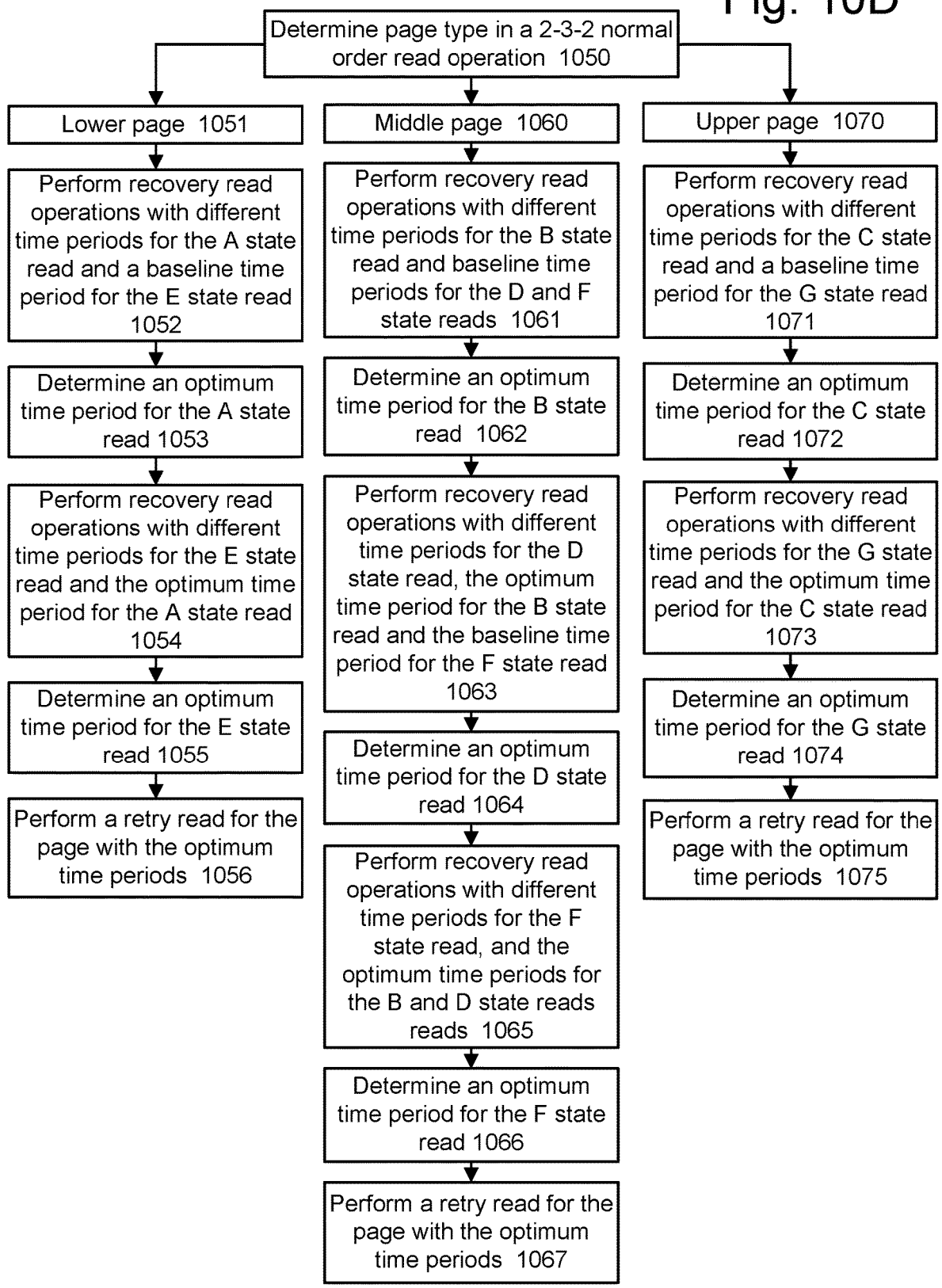
FIG. 10D depicts a flowchart of an example process for implementing the process of FIG. 10B in a 2-3-2 normal order read operation.

FIG. 10D depicts a flowchart of an example process for implementing the process of FIG. 10B in a 2-3-2 normal order read operation. In a normal order read operation, such as in FIG. 13A, the read voltages are applied starting from the lowest voltage and ending with the highest voltage. This type of read order may have over kick voltages when the voltage is increased from a lower level to a higher level. 2-3-2 refers to 2, 3 and 2 read voltages in the lower, middle and upper pages, respectively.

The example process begins at step 1050, which involves determining the page type in a 2-3-2 normal order read operation. This is the page type which was found to have an uncorrectable read error. Step 1051 indicates the page type is the lower page. Step 1052 performs recovery read operations with different time periods for the A state read and a baseline time period for the E state read. Step 1053 determines an optimum time period for the A state read. Step 1054 performs recovery read operations with different time periods for the E state read and the optimum time period for the A state read. Step 1055 determines an optimum time period for the E state read. Step 1056 performs a retry read for the page with the optimum time periods.

Step 1060 indicates the page type is the middle page. Step 1061 performs recovery read operations with different time periods for the B state read and a baseline time periods for the D and F state reads. Step 1062 determines an optimum time period for the B state read. Step 1063 performs recovery read operations with different time periods for the D state read, the optimum time period for the B state read, and the baseline time period for the F state read. Step 1064 determines an optimum time period for the D state read. Step 1065 performs recovery read operations with different time periods for the F state read, and the optimum time periods for the B and D state reads. Step 1066 determines an optimum time period for the F state read. Step 1067 performs a retry read for the page with the optimum time periods.

Step 1070 indicates the page type is the upper page. Step 1071 performs recovery read operations with different time periods for the C state read and a baseline time period for the G state read. Step 1072 determines an optimum time period for the C state read. Step 1073 performs recovery read operations with different time periods for the G state read and the optimum time period for the C state read. Step 1074 determines an optimum time period for the G state read. Step 1075 performs a retry read for the page with the optimum time periods.

In FIG. 11A-13C, the vertical dimension denotes voltage and the horizontal dimension denotes time. Vwl_sel, Vwl_unsel and Vbl are a selected word line voltage, an unselected word line voltage and a bit line voltage, respectively.

FIG. 11A depicts example voltage signals consistent with the lower page read of FIG. 10C1. Voltage signals 1100, 1105 and 1110 depict Vwl_sel, Vwl_unsel and Vbl, respectively. For Vwl_sel, a pre-read voltage spike from 0 V to Vpeak can be used to avoid read disturb on unselected strings. Vpeak may be less than Vread, for example. Vread can be, e.g., 8-9 V. After the spike is applied, the voltage transitions to VrD. This transition involves an under kick to VukD from t1-t2 and an over kick from VukD to VokD from t2-t3, before settling at VrD. t2-t3 is an example of a time allocated for a word line voltage over kick, from a start of the kick at t2 to an end of the kick at t3.

The word line voltage settling time may be t3-tsenD, where t3 is the peak of the over kick. Over kicks and under kicks can be used to decrease the time used to transition a voltage. The memory cells are sensed relative to VrD at the sense time, tsenD. Subsequently a post-read Vread spike at t5-t6 can be used to equalize the channel potential.

Vwl_unsel can be increased from 0 V to Vread, maintained at Vread during the sensing (reading) and returned to 0 V after the sensing.

Vbl can be increased from 0 V to an intermediate level, Vblint, and then to an over kick level, Vblok, before settling at a sensing level, Vsense. The bit line voltage settling time may be t4-tsenD, where t4 is the peak of the over kick.

A voltage signal may be provided for the SGD transistors of a selected sub-block to provide them in a conductive state during sensing. A voltage signal may be provided for the SGD transistors of an unselected sub-block to provide them in a non-conductive state during sensing. A voltage signal may be provided for the SGS transistors to provide them in a conductive state during sensing.

For Vwl_sel, t2 to t3 is an example of a baseline allocated voltage transition time, where the voltage transition is an over kick which starts to increase at t2 and stops increasing at t3. The over kick has a peak or inflection point a t3. t3 to tsenD is an example of a baseline allocated voltage transition time, where the voltage transition time is a word line voltage settling time. t4 to tsenD is also an example of a baseline allocated voltage transition time, where the voltage transition time is a bit line voltage settling time.

FIG. 11B depicts example voltage signals consistent with the middle page read of FIG. 10C1. Voltage signals 1115, 1120 and 1125 depict Vwl_sel, Vwl_unsel and Vbl, respectively. For Vwl_sel, a pre-read voltage spike is applied from t0-t1. After the spike is applied, the voltage transitions to VrF. This transition involves an under kick to VukF from t1-t2 and an over kick from VukF to VokF from t2-t3, before settling at VrF. The word line voltage settling time may be t3-tsenF, where t3 is the peak of the over kick. The memory cells are sensed relative to VrF at the sense time, tsenF. The peak of an over kick and the minimum point of an under kick are inflection points in the voltage signals.

A subsequent transition involves an under kick from VrF to VukC from t5-t6 before settling at VrC. The word line voltage settling time may be from t6, the minimum point of the under kick, to tsenC, when the memory cells are sensed relative to VrC.

A subsequent transition involves an under kick from VrC to VukA from t8-t9 before settling at VrA. The word line voltage settling time may be from t9, the minimum point of the under kick, to tsenA, when the memory cells are sensed relative to VrA.

Subsequently a post-read Vread spike at t11-t12 can be applied.

Vwl_unsel can be increased from 0 V to Vread, maintained at Vread during the sensing (reading) and returned to 0 V after the sensing.

Vbl can be increased from 0 V to an intermediate level, Vblint, and then to an over kick level, Vblok, before settling at Vsense at tsenF. Optionally, a voltage over kick at t6-t7 and t9-t10 is used before sensing at tsenC and tsenA, respectively. These over kicks help keep Vbl at the Vsense, since Vbl may decrease during sensing. The bit line voltage settling time may be from the peak at t4 to tsenF, from the peak at t7 to tsenC, and from the peak at t10 to tsenA for the F, C and A state reads, respectively.

t2-t5 is a time period for reading the set of memory cells relative to a first read voltage, VrF, t6-t8 is a time period for reading the set of memory cells relative to a second read voltage, VrC, and t9-t11 is a time period for reading the set of memory cells relative to a third read voltage, VrA.

FIG. 11C depicts example voltage signals consistent with the upper page read of FIG. 10C1. Voltage signals 1130, 1135 and 1140 depict Vwl_sel, Vwl_unsel and Vbl, respectively. For Vwl_sel, a pre-read voltage spike is applied from t0-t1. After the spike is applied, the voltage transitions to VrG. This transition involves an under kick to VukG from t1-t2 and an over kick from VukG to VokG from t2-t3, before settling at VrG. The word line voltage settling time may be from the peak of the over kick at t3 to tsenG, when the memory cells are sensed relative to VrG.

A subsequent transition involves an under kick from VrG to VukE from t5-t6 before settling at VrE. The word line voltage settling time may be from t6, the minimum point of the under kick, to tsenE, when the memory cells are sensed relative to VrE.

A subsequent transition involves an under kick from VrE to VukB from t8-t9 before settling at VrB. The word line voltage settling time may be from t9, the minimum point of the under kick, to tsenB, when the memory cells are sensed relative to VrB.

Subsequently a post-read Vread spike at ti1-t12 can be applied.

Vwl_unsel can be increased from 0 V to Vread, maintained at Vread during the sensing and returned to 0 V after the sensing.

Vbl can be increased from 0 V to an intermediate level, Vblint, and then to an over kick level, Vblok, before settling at Vsense at tsenG. Optionally, a voltage over kick at t6-t7 and t9-t10 is used before sensing at tsenE and tsenB, respectively. The bit line voltage settling time may be from the peak at t4 to tsenG, from the peak at t7 to tsenE, and from the peak at t10 to tsenB for the G, E and B state reads, respectively.

Figure 12A:
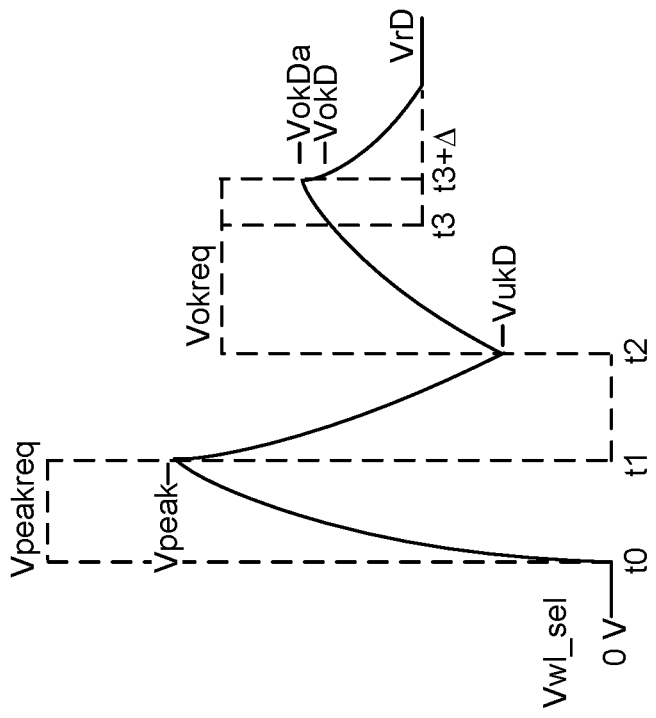
FIG. 12A depicts a portion of the voltage signal for Vwl_sel in FIG. 11A and a corresponding requested voltage output in a baseline read operation, consistent with step 1000 of FIG. 10A, where a baseline first time period t3-t2 is allocated for an over kick voltage, and a corresponding peak over kick voltage of VokD is reached.

FIG. 12A depicts a portion of the voltage signal for Vwl_sel in FIG. 11A and a corresponding requested voltage output in a baseline read operation, consistent with step 1000 of FIG. 10A, where a baseline first time period t3-t2 is allocated for an over kick voltage, and a corresponding peak over kick voltage of VokD is reached. The dashed lines denote a requested output voltage of the word line voltage driver 347 in FIG. 3. The actual output voltage lags the requested output voltage due to the RC time constant of the word line. In some cases, the actual output voltage will not reach the requested output voltage. From t0-t1, Vpeakreq is requested but the peak voltage, Vpeak<Vpeakreq, is reached at t1. From t1-t2, 0 V is requested but the minimum point, VukD>0 V is reached at t2. From t2-t3, Vokreq is requested but the peak voltage, VokD<Vokreq, is reached at t3.

Figure 12B:
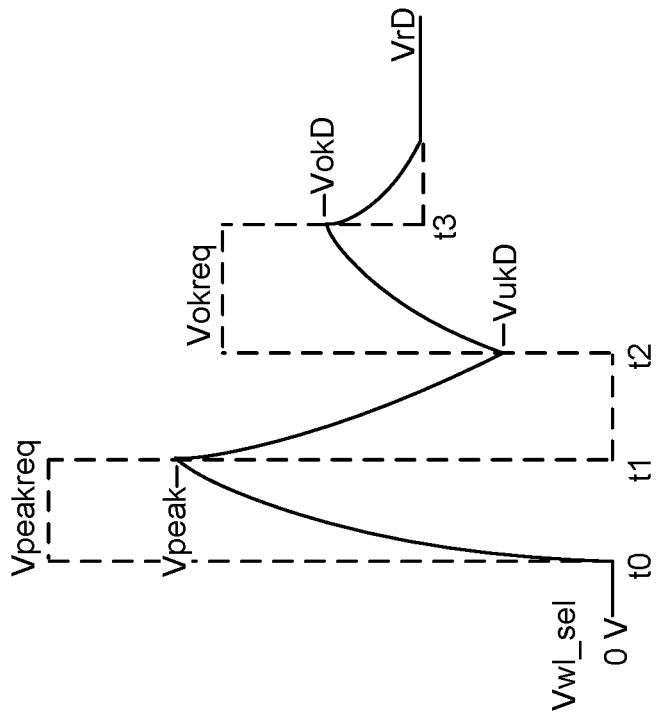
FIG. 12B depicts an alternative portion of the voltage signal for Vwl_sel in FIG. 11A and a corresponding requested voltage output in a recovery read operation, consistent with step 1022 of FIG. 10C1, where a recovery read time period t2 to t3+Δ is allocated for an over kick voltage, and a corresponding peak over kick voltage of VokDa is reached.

FIG. 12B depicts an alternative portion of the voltage signal for Vwl_sel in FIG. 11A and a corresponding requested voltage output in a recovery read operation, consistent with step 1022 of FIG. 10C1, where a baseline time period t2 to t3+Δ is allocated for an over kick voltage, and a corresponding peak over kick voltage of VokDa is reached. As in FIG. 12A, from t0-t1, Vpeakreq is requested but the peak voltage, Vpeak<Vpeakreq, is reached at t1, and from t1-t2, 0 V is requested but the minimum point, VukD>0 V is reached at t2. From t2 to t3+Δ, Vokreq is requested but the peak voltage, VokDa>VokD is reached at t3+Δ. This demonstrates that the allocated time period for the voltage kick can affect the voltage which is reached at the end of the time period, either as a peak or as a minimum point, when the RC delay is higher than the designed specification due to defects. Generally, a higher over kick or lower under kick is reached when the time period is greater. For example, different over kick or under kick voltage can be reached when different time periods are used for the over kick or under kick, respectively, in recovery read operations as described herein. If the time period is long enough, the voltage can reach the requested level.

It is also possible to adjust the requested level of an over kick or under kick in the recovery read operations.

Figure 13A:
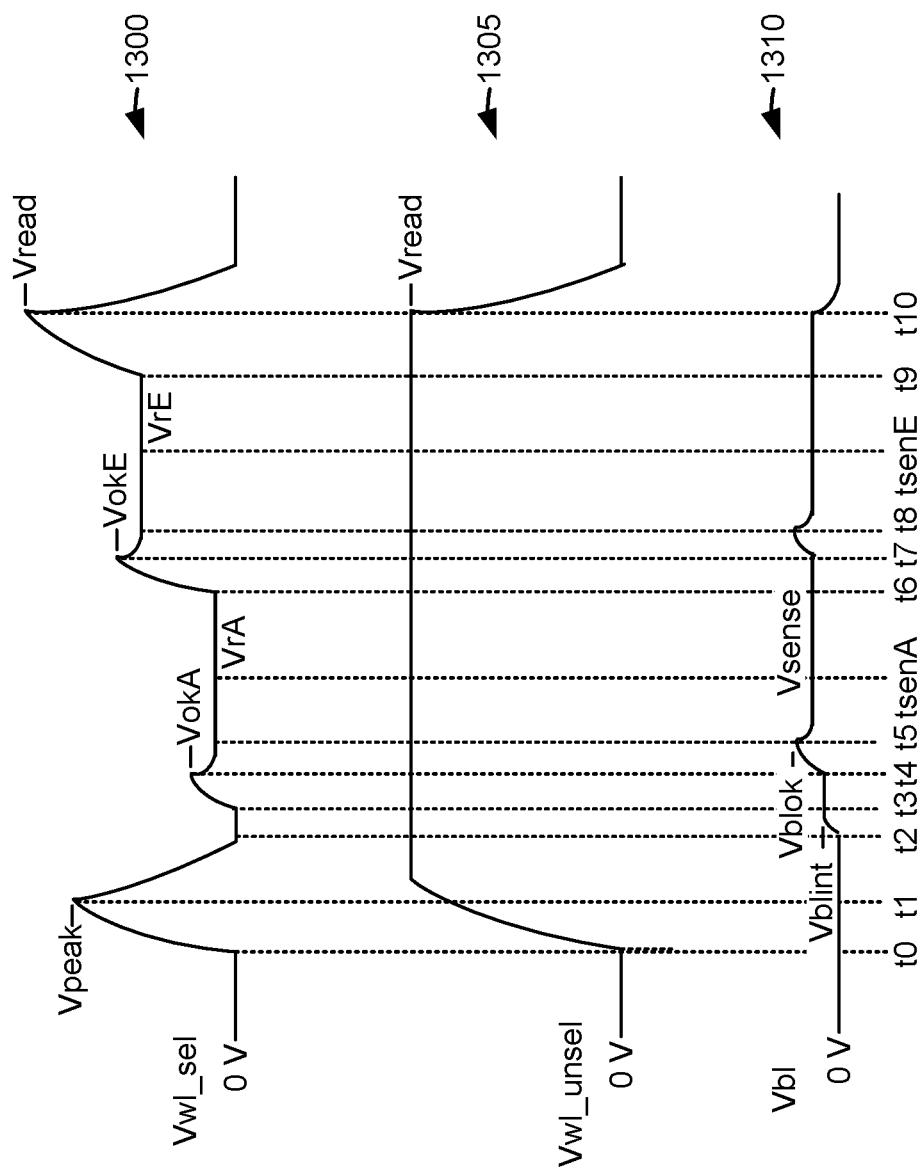
FIG. 13A depicts example voltage signals consistent with the lower page read of FIG. 10D.

In an example consistent with FIG. 14, there are seven allocated time periods for the over kick of Vwl_sel in a recovery read operation for a read voltage. The allocated time periods include BTP−Δ, BTP, BTP+Δ, BTP+2Δ, BTP+3Δ, BTP+4Δ and BTP+5Δ. The baseline time period BTP is represented by t2 to t3 in FIG. 12A. The time period BTP+Δ is represented by t3 to t3+Δ in FIG. 12B. The other time periods can be implemented by adjusting the time of the transition from Vokreq to VrD. Specifically, the time periods BTP−Δ, BTP, BTP+Δ, BTP+2Δ, BTP+3Δ, BTP+4Δ and BTP+5Δ can be implemented as t2 to t3−Δ, t2 to t3, t2 to t3+Δ, t2 to t3+2Δ, t2 to t3+3Δ, t2 to t3+4Δ and t2 to t3+5Δ, respectively FIG. 13A depicts example voltage signals consistent with the lower page read of FIG. 10D. Voltage signals 1300, 1305 and 1310 depict Vwl_sel, Vwl_unsel and Vbl, respectively. In this normal order read operation, the read voltages are applied in an increasing order. For Vwl_sel, a pre-read voltage spike from 0 V to Vpeak is applied. After the spike is applied, the voltage transitions to VrA. This transition can involve a return to 0 V at t2-t3 followed by an over kick to VokA from t3-t4 before settling at VrA. The word line voltage settling time may be t4-tsenA, where t4 is the peak of the over kick. The memory cells are sensed relative to VrA at the sense time, tsenA. Subsequently, Vwl_sel is increased from VrA to an over kick level, VokE, at t6-t7 before settling at VrE. The word line voltage settling time may be t7-tsenE, where t7 is the peak of the over kick. The memory cells are sensed relative to VrE at the sense time, tsenE. A post-read Vread spike can be applied at t9-t10.

Vwl_unsel can be increased from 0 V to Vread, maintained at Vread during the sensing (reading) and returned to 0 V after the sensing.

Vbl can be increased from 0 V to an intermediate level, Vblint, and then to an over kick level, Vblok, before settling at Vsense for the A state read. The bit line voltage settling time may be t5-tsenA, where t5 is the peak of the over kick. Vbl can increase from Vsense to the over kick level, Vblok, at t7-t8, before settling at Vsense for the E state read. The bit line voltage settling time may be t8-tsenE, where t8 is the peak of the over kick.

Figure 13B:
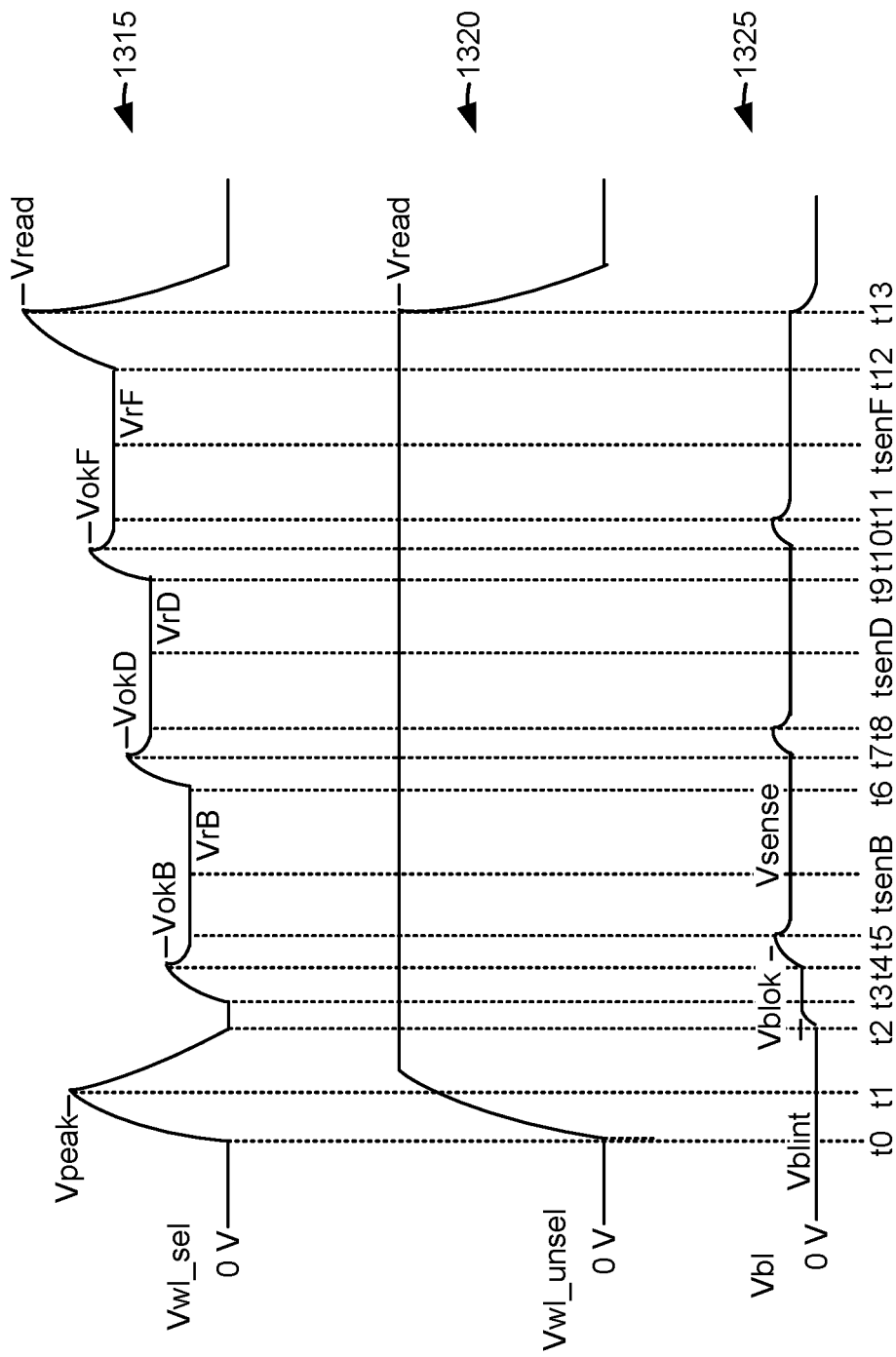
FIG. 13B depicts example voltage signals consistent with the middle page read of FIG. 10D.

FIG. 13B depicts example voltage signals consistent with the middle page read of FIG. 10D. Voltage signals 1315, 1320 and 1325 depict Vwl_sel, Vwl_unsel and Vbl, respectively. After the pre-read voltage spike, Vwl_sel has a voltage over kick to VokB at t3-t4 before settling at VrB. The word line voltage settling time may be t4-tsenB, where t4 is the peak of the over kick. The memory cells are sensed relative to VrB at the sense time, tsenB. Subsequently, Vwl_sel is increased from VrB to an over kick level, VokD, at t6-t7 before settling at VrD. The word line voltage settling time may be t7-tsenD, where t7 is the peak of the over kick. The memory cells are sensed relative to VrD at the sense time, tsenD. Subsequently, Vwl_sel is increased from VrD to an over kick level, VokF, at t9-t10 before settling at VrF. The word line voltage settling time may be t10-tsenF, where t10 is the peak of the over kick. The memory cells are sensed relative to VrF at the sense time, tsenF. A post-read Vread spike can be applied at t12-13.

Vwl_unsel can be increased from 0 V to Vread, maintained at Vread during the sensing (reading) and returned to 0 V after the sensing.

Vbl can be increased from 0 V to an intermediate level, Vblint, and then to an over kick level, Vblok, before settling at Vsense for the B state read. The bit line voltage settling time may be t5-tsenB, where t5 is the peak of the over kick. Subsequently, Vbl can increase from Vsense to the over kick level, Vblok, at t7-t8, before settling at Vsense for the D state read. The bit line voltage settling time may be t8-tsenD, where t8 is the peak of the over kick. Subsequently, Vbl can increase from Vsense to the over kick level, Vblok, at t10-t11, before settling at Vsense for the F state read. The bit line voltage settling time may be t11-tsenF, where t11 is the peak of the over kick.

Figure 13C:
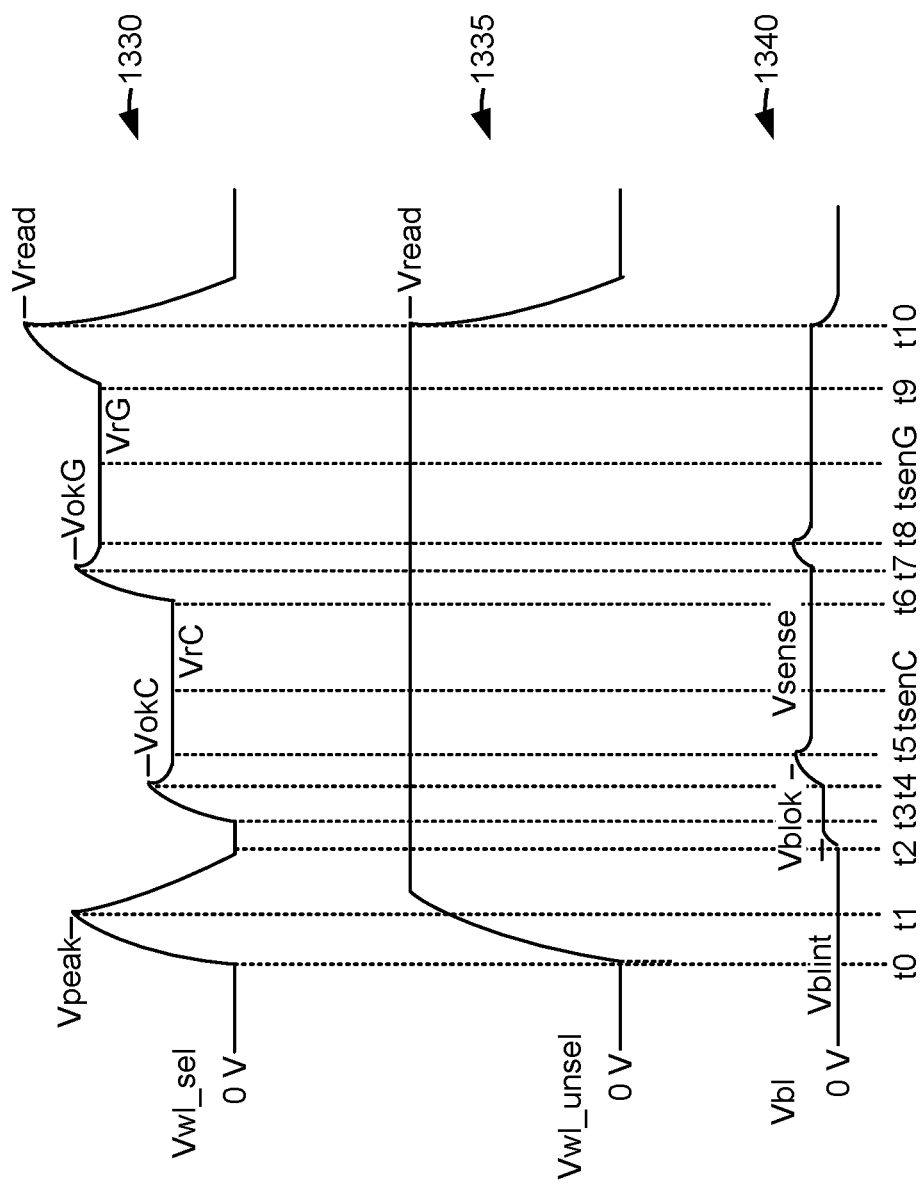
FIG. 13C depicts example voltage signals consistent with the upper page read of FIG. 10D.

FIG. 13C depicts example voltage signals consistent with the upper page read of FIG. 10D. Voltage signals 1330, 1335 and 1340 depict Vwl_sel, Vwl_unsel and Vbl, respectively. After the pre-read voltage spike, Vwl_sel has a voltage over kick to VokC at t3-t4 before settling at VrC. The word line voltage settling time may be t4-tsenC, where t4 is the peak of the over kick. The memory cells are sensed relative to VrC at the sense time, tsenC. Subsequently, Vwl_sel is increased from VrC to an over kick level, VokG, at t6-t7 before settling at VrG. The word line voltage settling time may be t7-tsenG, where t7 is the peak of the over kick. The memory cells are sensed relative to VrG at the sense time, tsenG. Subsequently, a post-read Vread spike can be applied at t9-t10.

Vwl_unsel can be increased from 0 V to Vread, maintained at Vread during the sensing (reading) and returned to 0 V after the sensing.

Vbl can be increased from 0 V to an intermediate level, Vblint, and then to an over kick level, Vblok, before settling at Vsense for the C state read. The bit line voltage settling time may be t5-tsenC, where t5 is the peak of the over kick. Subsequently, Vbl can increase from Vsense to the over kick level, Vblok, at t7-t8, before settling at Vsense for the G state read. The bit line voltage settling time may be t8-tsenG, where t8 is the peak of the over kick.

FIG. 14 depicts a plot of read errors versus time period for a voltage applied in different recovery read operations, consistent with step 1002 of FIG. 10A. The recovery read operations include different time periods including BTP−Δ, BTP and BTP+Δ to BTP+5Δ, where BTP denotes a baseline time period. In other examples, the recovery read operations do not include the base line time period. This example also includes time periods shorter than BTP and longer than BTP. Further, the time periods are spaced apart by equal increments of Δ. In an option, the time periods are spaced apart by different increments. The number of time periods can also vary from what is shown in this example.

A number of read errors for a page of data can be determined for each time period, e.g., from the ECC engine 245 of FIG. 1A. The number can include correctable and uncorrectable read errors, or just uncorrectable read errors, for example. The circles 1401-1407 denotes the number of read errors when the time period is BTP−Δ, BTP, BTP+Δ, BTP+2Δ, BTP+3Δ, BTP+4Δ and BTP+5Δ, respectively. A solid line 1420 denotes a curve fit to the read error data. In one approach, the optimum time period, TPopt, is set to the time period which has the lowest read error count, e.g., BTP+3Δ, represented by the circle 1405. This is an optimum time period from one recovery read operation. In another approach, TPopt is obtained by interpolating between the time periods which result in the two smallest number of errors, e.g., between BTP+3Δ and BTP+4Δ, represented by the circles 1405 and 1406. In this case, TPopt is set to the time period represented by the circle 1410. In one approach, TPopt=0.5×(BTP+3Δ and BTP+4Δ). This is an optimum time period based on two recovery read operations.

FIG. 15 depicts a table of commands for implementing different recovery read operations, consistent with the read timing table 112a of FIG. 1A and with step 1002 of FIG. 10A.

A device mode can be provided which triggers the recovery read operations. In one possible approach, a prefix command is provided in addition to a read command and a set feature. For instance, to read a lower page, the command sets a feature such as a read timing shift relative to a baseline period, for a particular voltage transition in the read operation. An example command to set a feature such as depicted in the table is: EFh-Add(YYh)-Din(B0)-Din(B1)-Din(B2)-Din(B3)-Din(B4)-Din(B5)-Din(B6)-Din(B7). EFh indicates a feature is being set. Add(YYh) is an address of the table. Din(B0)-Din(B7) are the bytes B0-B7, respectively, in the table.

The command subsequently includes the following command sequence: Prefix CMD XX-01h-00h-Address-30h=>Busy>Ready=>05h-Address-E0h=>Data-out. CMD XX is the prefix command. A prefix command is a command which precedes another related command. The prefix command can have a desired format and comprise one or more bytes, for instance. 01h is the feature/time period for the lower page. 00h and 30h refer to the first and second bytes of a read command. The Address refers to the address of the memory cells being read. The address can refer, e.g., to a word line, block and plane. "Busy" indicates that a ready/busy pin of the chip has a busy status and "Ready" indicates that the ready/busy pin of the chip has a ready status. 05h and E0h refer to the first and second bytes of a command for changing a read column.

To read a middle page in the recovery read operation, the command to set the features is used as discussed above. The following command sequence can then be used: Prefix CMD XX-02h-00h-Address-30h=>Busy>Ready=>05h-Address-E0h=>Data-out. The command sequence is the same as for the lower page except 02h is the feature/time period for the middle page.

To read an upper page in the recovery read operation, the command to set the features is used as discussed above. The following command sequence can then be used: Prefix CMD XX-03h-00h-Address-30h=>Busy>Ready=>05h-Address-E0h=>Data-out. The commands are the same as for the lower page except 03h is the feature/time period for the upper page.

A baseline read command can omit the above-mentioned prefix command. For example: 01h/02h/03h (lower/middle/upper page)-00h-Address-30h=>Busy>Ready=>05h-Address-E0h=>Data-out.

A control circuit can also issue a command to determine that a baseline read operation results in an uncorrectable read error, and command to determine an error count of a read recovery operation. These commands can be sent from the processor 122e to the ECC engine 245 in FIG. 1A, for example.

A control circuit can issue the commands to perform the baseline read operation and recovery read operations as discussed herein. The control circuit can be on the same die as the memory cells or on a separate die.

In another possible approach, the baseline read operation and recovery read operations are initiated by a device parameter on the memory chip.

Commands can be issued by the off-chip controller 122 to the on-chip control circuitry 110 including the state machine 112, for example. The on-chip control circuitry 110 including the state machine 112 can report back to the controller 122 with the read results.

In FIG. 15, a first column of the table denotes an address YYh. A second column of the table denotes data bytes B0-B7. A third column of the table defines a timing parameter corresponding to each data byte. For example, B0 defines the Vwl_sel kick timing step size, which can be the value $\Delta$ discussed in connection with FIG. 14. This is the increment between the different time periods allocated for an over or under kick in Vwl_sel. Optionally, an additional value can be defined in the table so that the value for the over kick can be different than the value for the under kick. B1 defines a Vwl_sel kick timing step multiplier. This can be one of the values −1 through 5, consistent with FIG. 13, for example, which define the time periods BTP−$\Delta$, BTP, BTP+$\Delta$, BTP+2$\Delta$, BTP+3$\Delta$, BTP+4$\Delta$ and BTP+5$\Delta$, respectively. For each recovery read operation, B1 can be set to the desired multiplier.

B2 defines the Vwl_sel settling timing step size. In the example of FIG. 11A, the baseline word line settling time can be t3 to tsenD. Similar to the over or under kick time periods, different time periods can be allocated for the settling time in increments of $\Delta$ below and above t3 to tsenD.

B4 defines the Vbl kick timing step size. B5 defines the Vbl kick timing step multiplier, B6 defines the Vbl settling timing step size, and B7 defines the Vbl settling timing step multiplier. These values are analogous to the corresponding values for Vwl_sel. In the example of FIG. 11A, the baseline bit line settling time can be t4 to tsenD. Different time periods can be allocated for the settling time in increments of $\Delta$ below and above t4 to tsenD. For example, the time periods can be t4 to tsenD−$\Delta$, t4 to tsenD, t4 to tsenD+$\Delta$, t4 to tsenD+2$\Delta$, t4 to tsenD+3$\Delta$, t4 to tsenD+4$\Delta$ and t4 to tsenD+5$\Delta$.

This table is an example only and various modifications are possible. The table values can differ for each read voltage of a page so that different step sizes and multipliers are used for the different read voltages in a page. For instance, in FIG. 11B, different step sizes and multipliers can be defined for the under kicks and settling times for the read voltages of the F, C and A states.

Accordingly, it can be seen that in one implementation, an apparatus comprises: a control circuit configured to connect to a set of memory cells. The control circuit is configured to: perform a baseline read operation of a page of data in the set of memory cells, the performing the baseline read operation comprises allocating a first baseline time period for a voltage transition when reading the set of memory cells relative to a first read voltage of the page; in response to the determining that the baseline read operation results in an uncorrectable read error, perform a first plurality of recovery read operations of the page of data, each recovery read operation of the first plurality of recovery read operations allocates a respective different first time period for the voltage transition when reading the set of memory cells relative to the first read voltage; determine an optimum first time period based on the first plurality of recovery read operations; and perform a retry read operation of the page of data, the performing the retry read operation comprises allocating the optimum first time period for the voltage transition when reading the set of memory cells relative to the first read voltage.

In another implementation, a method comprises: performing a baseline read operation of a page of data in a set of memory cells, the performing the baseline read operation comprises reading the set of memory cells relative to a first read voltage and a second read voltage; based on a result of the baseline read operation, re-reading the page of data a first plurality of times and re-reading the page of data a second plurality of times, the re-reading the page of data the first plurality of times comprises reading the page relative to the first read voltage with different allocated voltage transition times and reading the page relative to the second read voltage with a baseline allocated voltage transition time; determining a first optimum voltage transition time based on the re-reading the page of data the first plurality of times, the re-reading the page of data the second plurality of times comprises reading the page relative to the second read voltage with different allocated voltage transition times and reading the page relative to the first read voltage with the first optimum transition time; determining a second optimum voltage transition time based on the re-reading the page of data the second plurality of times; and reading the page of data relative to the first read voltage with the first optimum voltage transition time and relative to the second read voltage with the second optimum voltage transition time.

In another implementation, an apparatus comprises: a control circuit configured to connect to a set of memory cells; and an interface connected to the control circuit. The control circuit is configured to issue commands via the interface to: perform a first plurality of recovery read operations for the set of memory cells, each recovery read operation of the first plurality of recovery read operations allocates a different first time period for a voltage transition for reading the set of memory cells relative to a first read voltage; determine an optimum first time period based on the first plurality of recovery read operations; and perform a retry read operation of the set of memory cells, the performing the retry read operation comprises allocating the optimum first time period for the voltage transition when reading the set of memory cells relative to the first read voltage.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells, the circuit is configured to:
perform a baseline read operation of a page of data in the set of memory cells, the performing the baseline read operation comprises allocating a first baseline time period for a voltage transition when reading the set of memory cells relative to a first read voltage of the page;
in response to the determining that the baseline read operation results in an uncorrectable read error, perform a first plurality of recovery read operations of the page of data, each recovery read operation of the first plurality of recovery read operations allocates a respective different first time period for the voltage transition when reading the set of memory cells relative to the first read voltage;
determine an optimum first time period based on the first plurality of recovery read operations; and
perform a retry read operation of the page of data, the performing the retry read operation comprises allocating the optimum first time period for the voltage transition when reading the set of memory cells relative to the first read voltage.

2. The apparatus of claim 1, wherein:
to perform the baseline read operation, the control circuit is configured to allocate a second baseline time period for a voltage transition when reading the set of memory cells relative to a second read voltage of the page; and
to perform each recovery read operation of the first plurality of recovery read operations, the control circuit is configured to allocate the second baseline time period for the voltage transition when reading the set of memory cells relative to the second read voltage.

3. The apparatus of claim 2, wherein:
in response to the determining that the baseline read operation results in the uncorrectable read error, the control circuit is configured to perform a second plurality of recovery read operations of the page of data, each recovery read operation of the second plurality of recovery read operations allocates a respective different second time period for the voltage transition when reading the set of memory cells relative to the second read voltage;
the control circuit is configured to determine a second optimum time period based on the second plurality of recovery read operations; and
to perform the retry read operation, the control circuit is configured to allocate the second optimum time period for the voltage transition when reading the set of memory cells relative to the second read voltage.

4. The apparatus of claim 3, wherein:
to perform each recovery read operation of the second plurality of recovery read operations, the control circuit is configured to allocate the optimum first time period for the voltage transition when reading the set of memory cells relative to the first read voltage.

5. The apparatus of claim 1, wherein:
to determine the optimum first time period, the control circuit is configured to determine a read error count for each recovery read operation of the first plurality of recovery read operations, determine two recovery read operations of the first plurality of recovery read operations which have a lowest read error count, and interpolate between time periods of the two recovery read operations which have the lowest read error count.

6. The apparatus of claim 1, wherein:
to determine the optimum first time period, the control circuit is configured to determine a read error count for each recovery read operation of the first plurality of recovery read operations, and determine a recovery read operations of the first plurality of recovery read operations which has a lowest read error count.

7. The apparatus of claim 1, wherein:
a word line is connected to the set of memory cells; and
the voltage transition when reading the set of memory cells relative to the first read voltage comprises a voltage kick on the word line.

8. The apparatus of claim 1, wherein:
a word line is connected to the set of memory cells; and
the voltage transition when reading the set of memory cells relative to the first read voltage comprises a voltage settling time on the word line.

9. The apparatus of claim 1, wherein:
each memory cell in the set of memory cells is in a respective NAND string;
each NAND string is connected to a respective bit line; and
the voltage transition when reading the set of memory cells relative to the first read voltage comprises a voltage kick on the bit line.

10. The apparatus of claim 1, wherein:
each memory cell in the set of memory cells is in a respective NAND string;
each NAND string is connected to a respective bit line; and
the voltage transition when reading the set of memory cells relative to the first read voltage comprises a voltage settling time on the bit line.

11. The apparatus of claim 1, wherein:
the control circuit is configured to apply the first read voltage to the set of memory cells when reading the set of memory cells relative to the first read voltage during each recovery read operation of the first plurality of recovery read operations.

12. A method, comprising:
performing a baseline read operation of a page of data in a set of memory cells, the performing the baseline read operation comprises reading the set of memory cells relative to a first read voltage and a second read voltage;
based on a result of the baseline read operation, re-reading the page of data a first plurality of times and re-reading the page of data a second plurality of times, the re-reading the page of data the first plurality of times comprises reading the page relative to the first read voltage with different allocated voltage transition times and reading the page relative to the second read voltage with a baseline allocated voltage transition time;

determining a first optimum voltage transition time based on the re-reading the page of data the first plurality of times, the re-reading the page of data the second plurality of times comprises reading the page relative to the second read voltage with different allocated voltage transition times and reading the page relative to the first read voltage with the first optimum transition time;

determining a second optimum voltage transition time based on the re-reading the page of data the second plurality of times; and reading the page of data relative to the first read voltage with the first optimum voltage transition time and relative to the second read voltage with the second optimum voltage transition time.

13. The method of claim 12, further comprising:

applying the first read voltage to the set of memory cells during each time of the first plurality of times of reading the set of memory cells relative to the first read voltage; and applying the second read voltage to the set of memory cells during each time of the second plurality of times of reading the set of memory cells relative to the second read voltage.

14. The method of claim 12, wherein:

the first optimum transition time is a time from a word line voltage inflection point to a sense time for reading the set of memory cells relative to the first read voltage.

15. The method of claim 12, wherein:

the first optimum transition time is a time allocated for a word line voltage kick, from a start of the word line voltage kick to an end of the word line voltage kick.

16. An apparatus, comprising:

a control circuit configured to connect to a set of memory cells; and an interface connected to the control circuit, the control circuit is configured to issue commands via the interface to:

perform a first plurality of recovery read operations for the set of memory cells, each recovery read operation of the first plurality of recovery read operations allocates a different first time period for a voltage transition for reading the set of memory cells relative to a first read voltage;

determine an optimum first time period based on the first plurality of recovery read operations; and perform a retry read operation of the set of memory cells, the performing the retry read operation comprises allocating the optimum first time period for the voltage transition when reading the set of memory cells relative to the first read voltage.

17. The apparatus of claim 16, wherein the control circuit is configured to issue commands via the interface to:

perform a baseline read operation of the set of memory cells;

determine that the baseline read operation results in an uncorrectable read error; and perform the first plurality of recovery read operations in response to the determining that the baseline read operation results in the uncorrectable read error.

18. The apparatus of claim 16, wherein:

the voltage transition comprises a word line voltage settling time.

19. The apparatus of claim 16, wherein:

the voltage transition comprises a word line voltage kick.

20. The apparatus of claim 16, wherein:

each memory cell in the set of memory cells is in a respective NAND string;

each NAND string is connected to a respective bit line; and the voltage transition comprises a bit line voltage settling time.

* * * * *